(12) United States Patent
Takayanagi et al.

(10) Patent No.: US 9,978,843 B2
(45) Date of Patent: May 22, 2018

(54) SILICON CARBIDE SEMICONDUCTOR DEVICE

(71) Applicant: Fuji Electric Co., Ltd., Kanagawa (JP)

(72) Inventors: Ryohei Takayanagi, Nagano (JP); Hiroki Wakimoto, Nagano (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days. days.

(21) Appl. No.: 15/665,845

(22) Filed: Aug. 1, 2017

(65) Prior Publication Data

US 2018/0076290 A1 Mar. 15, 2018

(30) Foreign Application Priority Data

Sep. 14, 2016 (JP) ................................. 2016-180033

(51) Int. Cl.
*H01L 29/15* (2006.01)
*H01L 29/16* (2006.01)
(Continued)

(52) U.S. Cl.
CPC .... *H01L 29/1608* (2013.01); *H01L 21/02378* (2013.01); *H01L 21/02428* (2013.01); (Continued)

(58) Field of Classification Search
CPC .......... H01L 29/1608; H01L 29/02378; H01L 29/39; H01L 29/66712; H01L 29/0696; (Continued)

(56) References Cited

U.S. PATENT DOCUMENTS

2014/0113421 A1* 4/2014 Harada ............... H01L 21/0465
438/285
2015/0102363 A1* 4/2015 Tanaka .................. H01L 21/046
257/77

(Continued)

FOREIGN PATENT DOCUMENTS

JP 2004-335720 A 11/2004
JP 2013-232574 A 11/2013
(Continued)

OTHER PUBLICATIONS

M. Skowronski et al., "Degradation of hexagonal silicon-carbide-based bipolar devices", Journal of Applied Physics, (USA), American Institute of Physics, 2006, vol. 99, pp. 011101-1 to 24 (Mentioned in paragraph Nos. 3 and 10 of the as-filed specification.)

*Primary Examiner* — Ahmed Sefer
(74) *Attorney, Agent, or Firm* — Chen Yoshimura LLP

(57) ABSTRACT

An embodiment of a silicon carbide semiconductor device includes one or more inner cells each having a MOSFET and one or more outer peripheral cells that does not have a MOSFET structure, and the area (surface area) of the $p^+$ contact region of each of the outermost peripheral cells is less than the surface area of an $p^+$ contact region of each of the inner cells, for example, so that a unit total resistance of $p^+$ contact regions of the outermost peripheral cells, as measured in a depth direction of the semiconductor substrate with respect to a unit area in a surface of the semiconductor substrate, is greater than a unit total resistance of the $p^+$ contact regions of the inner cells, as measured in the depth direction of the semiconductor substrate with respect to the unit area in the surface of the semiconductor substrate.

13 Claims, 9 Drawing Sheets

(51) Int. Cl.
    *H01L 29/06*         (2006.01)
    *H01L 29/36*         (2006.01)
    *H01L 29/417*       (2006.01)
    *H01L 29/32*         (2006.01)
    *H01L 29/78*         (2006.01)
    *H01L 21/02*         (2006.01)
    *H01L 21/04*         (2006.01)
    *H01L 29/66*         (2006.01)
    *H01L 29/08*         (2006.01)
    *H01L 29/10*         (2006.01)
    *H01L 29/739*       (2006.01)
    *H01L 29/167*       (2006.01)

(52) U.S. Cl.
    CPC .. *H01L 21/02433* (2013.01); *H01L 21/02529* (2013.01); *H01L 21/02634* (2013.01); *H01L 21/046* (2013.01); *H01L 21/0475* (2013.01); *H01L 29/0688* (2013.01); *H01L 29/0696* (2013.01); *H01L 29/32* (2013.01); *H01L 29/36* (2013.01); *H01L 29/41741* (2013.01); *H01L 29/66068* (2013.01); *H01L 29/66712* (2013.01); *H01L 29/7802* (2013.01); *H01L 29/0615* (2013.01); *H01L 29/0865* (2013.01); *H01L 29/0882* (2013.01); *H01L 29/1095* (2013.01); *H01L 29/167* (2013.01); *H01L 29/7395* (2013.01); *H01L 29/7804* (2013.01); *H01L 29/7811* (2013.01)

(58) Field of Classification Search
    CPC ............. H01L 29/7395; H01L 29/1095; H01L 29/41741; H01L 21/02428; H01L 29/7811; H01L 21/0475
    See application file for complete search history.

(56) References Cited

U.S. PATENT DOCUMENTS

2015/0214164 A1*   7/2015   Matocha ............... H01L 23/564
                                                              257/77
2015/0380503 A1*  12/2015   Nakano ................. H01L 29/407
                                                              257/77

FOREIGN PATENT DOCUMENTS

| JP | 2015-2207 A | 1/2015 |
|----|-------------|--------|
| JP | 2015-2277 A | 1/2015 |
| JP | 5680299 B2  | 3/2015 |

* cited by examiner

SILICON CARBIDE SEMICONDUCTOR DEVICE

BACKGROUND OF THE INVENTION

Technical Field

The present invention relates to a silicon carbide semiconductor device.

Background Art

Silicon carbide (SiC) has attracted attention as a next-generation semiconductor material. Silicon carbide semiconductor devices make it possible to reduce the resistance of the device in the ON state (the on-resistance) to several hundredths of that of conventional silicon (Si) semiconductor devices, can be used in high temperature environments of greater than or equal to 200° C., and offer various other advantages. This is a result of the advantageous properties of the silicon carbide material itself, which in the four-layer hexagonal (4H-SiC) form has a 3.25 eV bandgap that is approximately three times greater than the bandgap of silicon (1.12 eV) as well as a breakdown field strength of nearly an order of magnitude greater than the breakdown field strength of silicon (2 mV/cm to 4 mV/cm).

Various silicon carbide semiconductor devices have previously been prototyped, including rectifying devices such as diodes and switching devices such as transistors and thyristors, for example. However, silicon carbide semiconductor substrates (hereinafter "silicon carbide substrates") tend to have dislocations in various internal portions. It is known that when a device is formed (manufactured) on a silicon carbide substrate, the recombination of electron-hole pairs during operation of the device induces movement of the dislocations within the silicon carbide substrate and thereby results in growth of stacking faults (see Non-Patent Document 1, for example). These stacking faults negatively affect device performance and increase conduction loss in power modules. Therefore, it is desirable to prevent formation of stacking faults.

One proposed method of preventing formation of stacking faults within silicon carbide substrates involves producing a silicon carbide epitaxial wafer that includes an epitaxial growth layer having low basal plane dislocation density and low stacking fault density in order to improve the quality of the silicon carbide substrate (see Patent Document 1, for example). However, this method cannot yet completely eliminate dislocations and stacking faults within the silicon carbide substrate. Therefore, when a device is formed on the silicon carbide substrate, the stacking faults still expand as described above.

One proposed device for preventing expansion of stacking faults includes stripe-shaped current-limiting regions formed extending parallel to the principal surface of the silicon carbide substrate between the base regions of adjacent cells (the functional unit for elements) in the active region (see Patent Document 2 (paragraphs [0032] to [0038] and FIGS. 1 and 2), for example). In Patent Document 2, forming these current-limiting regions parallel to the step-flow growth direction of the epitaxial growth layer of the silicon carbide substrate prevents expansion of stacking faults.

In another proposed device for preventing expansion of stacking faults, fault stop regions that include a trench-shaped groove going through the epitaxial growth layer of the silicon carbide substrate in the depth direction thereof as well as an insulator filled into that groove are formed in the active region (see Patent Document 3 (paragraph [0029] and FIGS. 1 and 2), for example). In Patent Document 3, these fault stop regions are formed dividing the epitaxial growth layer of the silicon carbide substrate into a matrix pattern in order to prevent expansion of stacking faults.

In yet another proposed device for preventing expansion of stacking faults, current-limiting regions are selectively buried in the epitaxial growth layer (which functions as a drift layer) within the active region (see Patent Document 4 (paragraph [0025] and FIG. 2), for example). In Patent Document 4, when stacking faults that expand from the silicon carbide starting substrate to within the drift layer grown on that starting substrate reach these current-limiting regions, the supply of recombination energy to the stacking faults is stopped, thereby stopping expansion of the stacking faults.

In another proposed device, the gaps between cathode layers arranged in a dotted layout within a collector layer are set to a small value near the center of the semiconductor substrate and set to increasingly large values moving outwards towards the periphery of the semiconductor substrate (see Patent Document 5 (paragraph [0019] and FIGS. 1 and 2), for example). In Patent Document 5, the ratio of the collector layers (which tend to generate heat) per unit area is decreased near the periphery of the semiconductor substrate (which is prone to temperature increases).

RELATED ART DOCUMENTS

Patent Documents

Patent Document 1: Japanese Patent Application Laid-Open Publication No. 2015-2207
Patent Document 2: Japanese Patent Application Laid-Open Publication No. 2013-232574
Patent Document 3: Japanese Patent Application Laid-Open Publication No. 2004-335720
Patent Document 4: Japanese Patent Application Laid-Open Publication No. 2015-2277
Patent Document 5: Japanese Patent No. 5680299

Non-Patent Document

Non-Patent Document 1: M. Skowronski et al, Degradation of hexagonal silicon-carbide-based bipolar devices, Journal of Applied Physics, (USA), American Institute of Physics, 2006, Vol. 99, 011101-1 to 24

SUMMARY OF THE INVENTION

However, in Patent Documents 2 to 4, forming regions that do not conduct current when the MOSFET is ON (the current-limiting regions or the fault stop regions) within the active region reduces the drift current and thereby reduces the current carrying capability of the device. Moreover, forming trench-shaped grooves in the silicon carbide substrate or selectively forming current-limiting regions or fault stop regions within the silicon carbide substrate increases process complexity. These approaches also increase production costs. In Patent Document 5, the area of the collector layers is adjusted to control temperature increases, which means that this solution cannot be applied to MOSFETs.

The present invention was made to solve the problems in the conventional technologies described above and aims to provide a silicon carbide semiconductor device that makes it possible to maintain current carrying capability as well as inhibit the formation of stacking faults. Accordingly, the present invention is directed to a scheme that substantially obviates one or more of the problems due to limitations and disadvantages of the related art.

Additional or separate features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, in one aspect, the present disclosure provides a silicon carbide semiconductor device, including: a semiconductor substrate made of silicon carbide, the semiconductor substrate having one or more of first cells and one or more of second cells defined therein; wherein each of the first cells includes: a first semiconductor region of a first conductivity type formed in a surface layer of a first principal surface of the semiconductor substrate; a second semiconductor region of a second conductivity type selectively formed in a surface layer of a second principal surface of the semiconductor substrate; a third semiconductor region of the first conductivity type that is formed between the first semiconductor region and the second semiconductor region, contacts the first semiconductor region and the second semiconductor region, and has a lower impurity concentration than the first semiconductor region; a fourth semiconductor region of the first conductivity type selectively formed within the second semiconductor region; a fifth semiconductor region of the second conductivity type that is selectively formed within the second semiconductor region and has a higher impurity concentration than the second semiconductor region; a gate insulating film formed contacting a region of the second semiconductor region between the third semiconductor region and the fourth semiconductor region; and a gate electrode formed on a side opposite to the second semiconductor region with the gate insulating film between the gate electrode and the second semiconductor region, wherein each of the second cells has the same constructions as the first cell with respect to the first to fifth semiconductor regions except that the fourth semiconductor region of the first conductivity type is absent and that the respective fifth semiconductor regions in the first and second cells may or may not be different in property or dimension, wherein the silicon carbide semiconductor device further includes: a first electrode that contacts the fourth semiconductor region and the fifth semiconductor region of each of the first cells and the fifth semiconductor region of each of the second cells; and a second electrode that contacts the first semiconductor region of each of the first cells and each of the second cells, and wherein a unit total resistance of the fifth semiconductor regions of the second cells, as measured in a depth direction of the semiconductor substrate with respect to a unit area in a surface of the semiconductor substrate, is greater than a unit total resistance of the fifth semiconductor regions of the first cells, as measured in the depth direction of the semiconductor substrate with respect to the unit area in the surface of the semiconductor substrate.

Moreover, in the silicon carbide semiconductor device according to one aspect of the present invention as described above, the first cells are arranged in a plurality in a matrix-shaped layout in an active region, the second cells are arranged in a plurality in a layout that runs along an outer periphery of the active region and surrounds a periphery of the active region, and a surface area of the fifth semiconductor region of each of the second cells is less than a surface area of the fifth semiconductor region of each of the first cells.

Furthermore, in the silicon carbide semiconductor device according to one aspect of the present invention as described above, the first cells are arranged in a plurality in a matrix-shaped layout in an active region, the second cells are arranged in a plurality in a layout that runs along an outer periphery of the active region and surrounds a periphery of the active region, and a number of the second cells per unit area is less than a number of the first cells per unit area.

In addition, in the silicon carbide semiconductor device according to one aspect of the present invention as described above, the second cells are provided in a plurality, and the fifth semiconductor regions of the plurality of second cells are arranged separated from one another at equally spaced intervals.

Moreover, in the silicon carbide semiconductor device according to one aspect of the present invention as described above, the first cells are arranged in a plurality in a matrix-shaped layout in an active region, the second cells are arranged in a plurality in a layout that runs along an outer periphery of the active region and surrounds a periphery of the active region, and an impurity concentration of the fifth semiconductor regions of each of the second cells is less than an impurity concentration of the fifth semiconductor regions of each of the first cells.

Furthermore, in the silicon carbide semiconductor device according to one aspect of the present invention as described above, the first cells are arranged in a plurality in a stripe-shaped layout in an active region, the second cell is provided singly and has a rectangular frame shape that runs along an outer periphery of the active region and surrounds a periphery of the active region, and a width of the fifth semiconductor region of the second cell is less than a width of the fifth semiconductor region of each of the first cells.

In addition, in the silicon carbide semiconductor device according to one aspect of the present invention as described above, the first cells are arranged in a plurality in a stripe-shaped layout in an active region; the second cell is provided singly and has a rectangular frame shape that runs along an outer periphery of the active region and surrounds a periphery of the active region; the fifth semiconductor region of the second cell is arranged in a plurality in a layout that runs along the outer periphery of the active region and surrounds the periphery of the active region; and, among the plurality of fifth semiconductor regions of the second cell, a total surface area of the fifth semiconductor regions that are arranged running in a first direction in which the first cell extends in the stripe shape is less than a surface area of the fifth semiconductor region of each of the first cells.

Moreover, in the silicon carbide semiconductor device according to one aspect of the present invention as described above, the first cells are arranged in a plurality in a stripe-shaped layout in an active region, the second cell is provided singly and has a rectangular planar shape that runs along an outer periphery of the active region and surrounds a periphery of the active region, and an impurity concentration of the fifth semiconductor region of the second cell is less than an impurity concentration of the fifth semiconductor region of each of the first cells.

Furthermore, the semiconductor device according to one aspect of the present invention as described above is mounted in a power module.

The invention as described above makes it possible to reduce current concentration in portions directly beneath the fifth semiconductor regions of the second cells when parasitic diodes in which the fifth semiconductor regions and the second semiconductor regions are the anodes and the third semiconductor region is the cathode turn on. This makes it possible to reduce the incidence of recombination of electron-hole pairs in the portions directly beneath the fifth semiconductor regions of the second cells. In this way, the cell structure of the first cells (which occupy a large area on the chip) can be used to control how easily stacking faults form. Moreover, in the invention as described above, no regions that do not conduct current when the silicon carbide semiconductor device is ON (such as the current-limiting regions or the fault stop regions in the patent documents described above) are formed within the active region, and therefore the current carrying capability of the silicon carbide semiconductor device is not reduced.

The silicon carbide semiconductor device according to the present invention makes it possible to maintain current carrying capability as well as inhibit the formation of stacking faults. It is to be understood that both the foregoing general description and the following detailed description are exemplary and explanatory, and are intended to provide further explanation of the invention as claimed.

DETAILED DESCRIPTION OF EMBODIMENTS

Figure 1:
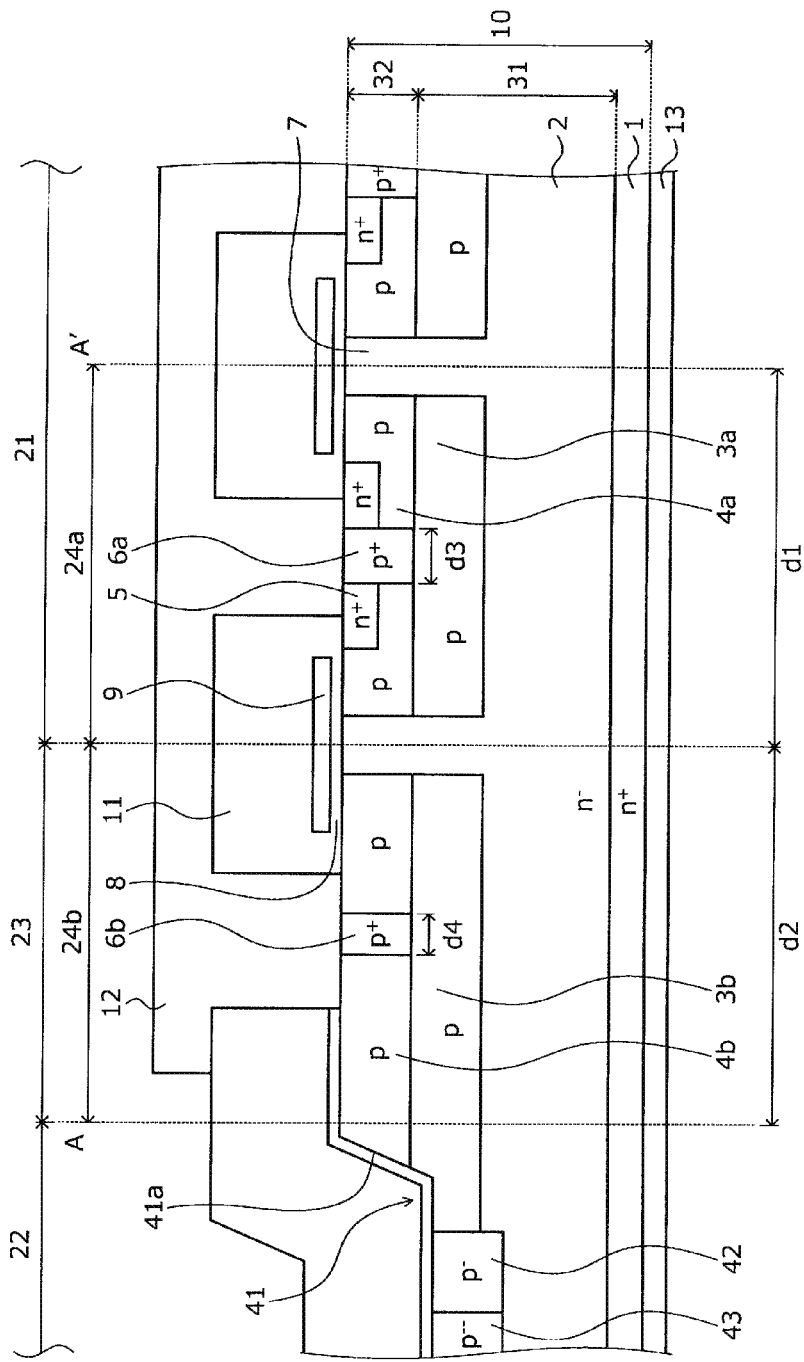
FIG. 1 is a cross-sectional view illustrating the structure of a silicon carbide semiconductor device according to Embodiment 1.

Preferred embodiments of a silicon carbide semiconductor device according to the present invention will be described in detail below with reference to the attached drawings. In the present specification and the attached drawings, the letters "n" and "p" are used to indicate whether the majority carriers in a layer or region are electrons or holes, respectively. Moreover, the symbols + and − are appended to the letters n and p to indicate layers or regions having a higher or lower impurity concentration, respectively, than layers or regions in which the + and − symbols are not appended. In the descriptions of the embodiments and the attached drawings, the same reference characters are used to indicate components that are the same, and redundant descriptions of the same components are omitted. Furthermore, the following notation is used for Miller indices in the present specification: the symbol − indicates a bar to be applied to the immediately following index that follows the − symbol; that is, the symbol − is inserted before an index to indicate that that index is negative.

Embodiment 1

Figure 2:
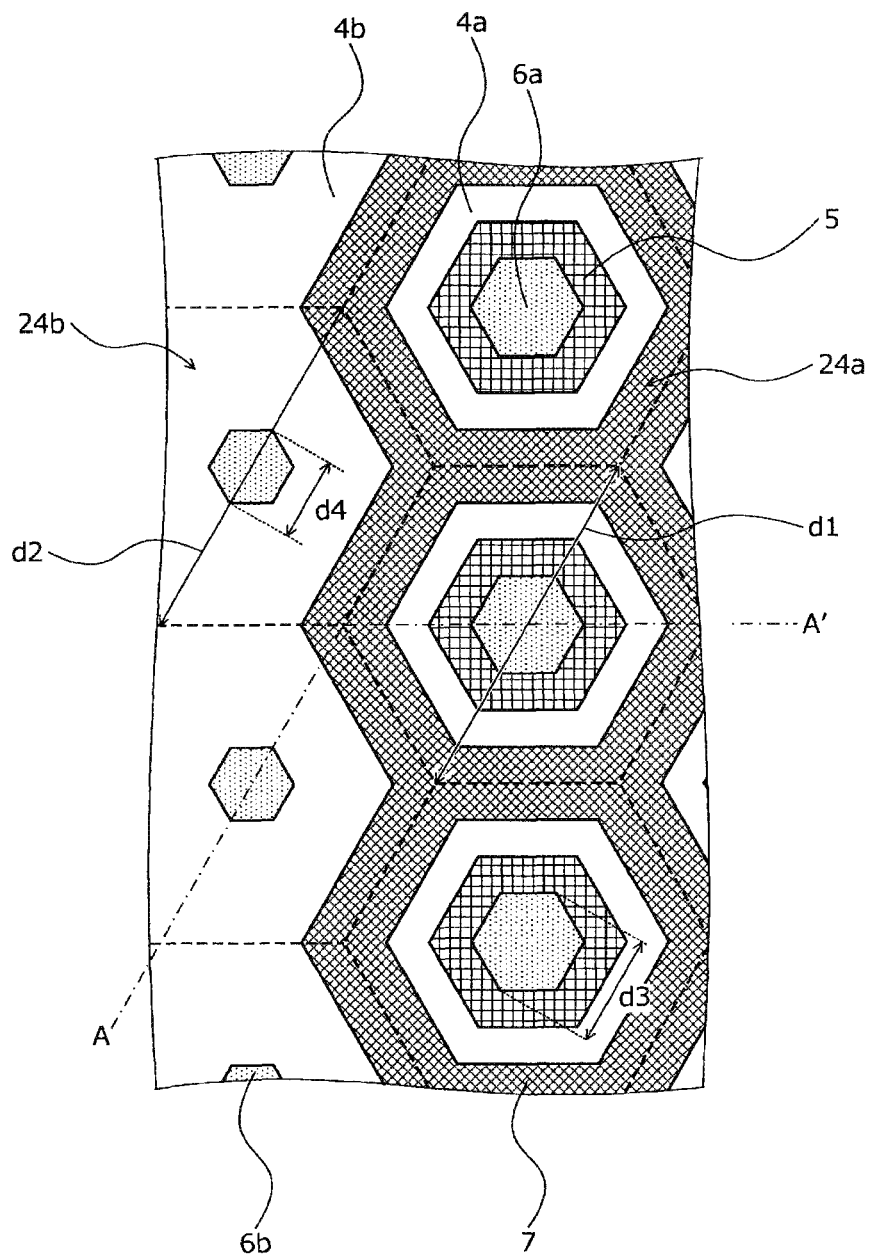
FIG. 2 is a plan view illustrating the planar layout of the primary components in FIG. 1.
Figure 3:
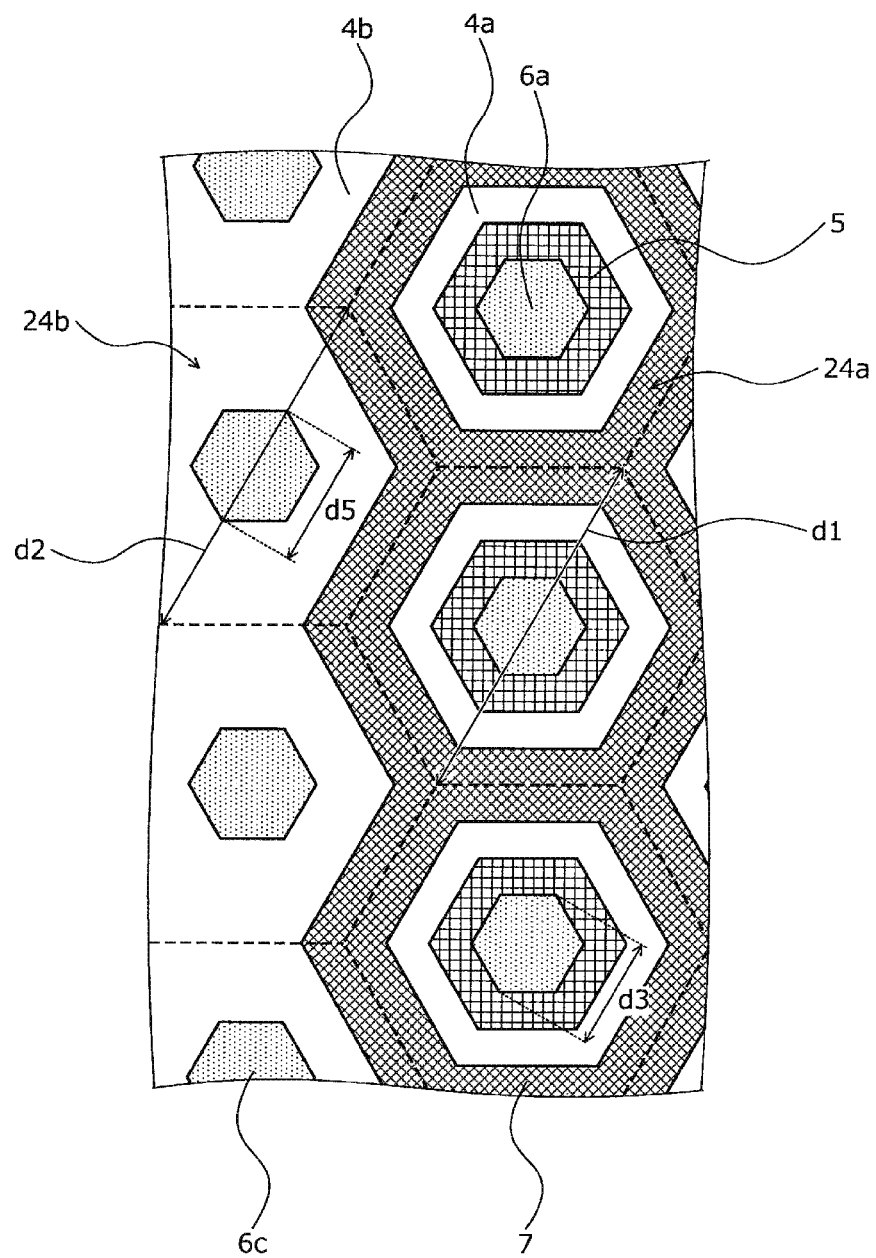
FIG. 3 is a plan view illustrating the planar layout of a silicon carbide semiconductor device according to Comparison Example 1.
Figure 4:
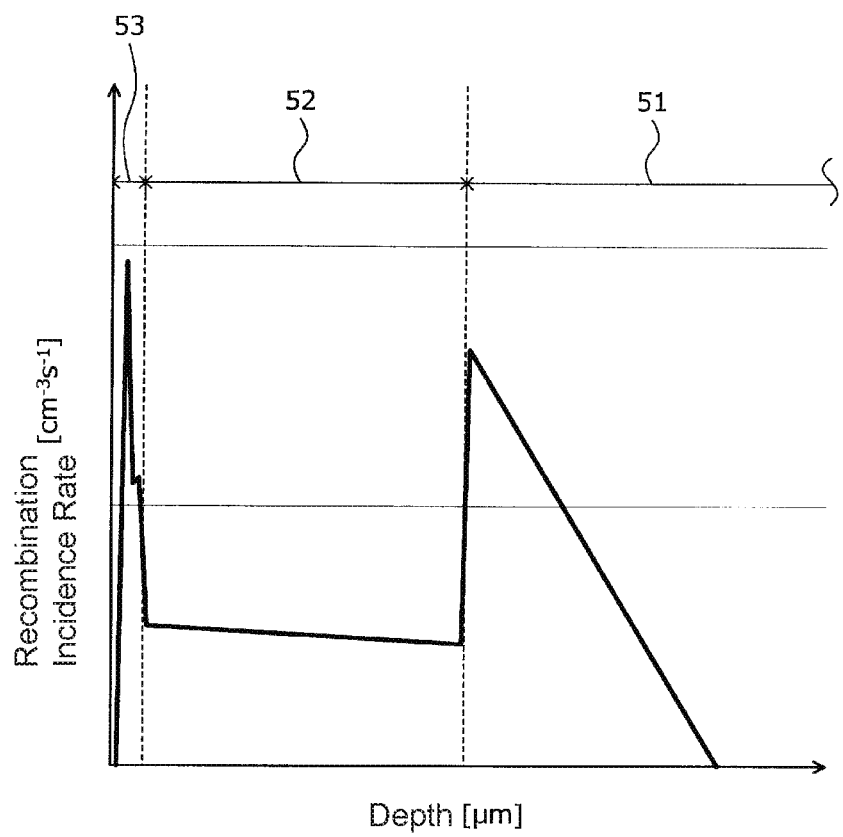
FIG. 4 is a characteristic diagram showing the incidence of recombination in a conventional MOSFET.

Next, the structure of a silicon carbide (SiC) semiconductor device according to Embodiment 1 will be described using a MOSFET as an example. FIG. 1 is a cross-sectional view illustrating the structure of the silicon carbide semiconductor device according to Embodiment 1. FIG. 1 illustrates a cross section taken along line A-A' in FIG. 2. FIG. 2 is a plan view illustrating the planar layout of the primary components in FIG. 1. Here, "planar layout" refers to the planar shape and arrangement of the components as viewed from the front surface side of a silicon carbide substrate 10. FIG. 3 is a plan view illustrating the planar layout of a silicon carbide semiconductor device according to Comparison Example 1. FIG. 4 is a characteristic diagram showing the incidence of recombination in a conventional MOSFET. In FIG. 4, the horizontal axis represents the depth in a direction going towards the drain electrode side from a boundary (of depth 0 μm) between the semiconductor substrate and the source electrode, and the vertical axis represents the incidence of recombination within the semiconductor substrate.

As illustrated in FIG. 1, the silicon carbide semiconductor device according to Embodiment 1 includes an active region 21 formed in a center portion of a silicon carbide substrate (semiconductor chip) 10 as well as an edge termination region 22 that surrounds the periphery of the active region 21. The active region 21 is the region through which current flows when the device is in the ON state. The edge termination region 22 is a region within an $n^-$ drift region 2 that maintains the withstand voltage by reducing the strength of the electric field on the front surface (hereinafter, "substrate front surface") side of the silicon carbide substrate 10. In the silicon carbide substrate 10, a plurality of unit cells (the functional unit for elements) are arranged in a prescribed layout. FIG. 1 illustrates a unit cell (hereinafter, "inner peripheral cell") 24a arranged on the outermost side (chip edge side) of the active region 21, approximately half of another inner peripheral cell 24a that is adjacent to the inner side (chip center side) of this inner peripheral cell 24a, and a unit cell (hereinafter, "outermost peripheral cell") 24b in a boundary region 23 (described below) (this also applies to FIGS. 6 to 9).

The silicon carbide substrate 10 is an epitaxial substrate in which silicon carbide layers 31 and 32 (which will respectively become the $n^-$ drift region 2 and second p-type base regions 4a and 4b) are epitaxially grown in order on the front surface of an $n^+$ starting substrate 1 made of silicon carbide. The $n^+$ starting substrate 1 functions as an $n^+$ drain region. In the active region 21, a MOS gate structure for the inner peripheral cell 24a is formed on the front surface side of the silicon carbide substrate 10 (that is, on the surface on the n silicon carbide layer 31 side). More specifically, the MOS gate structure for the inner peripheral cell 24a includes first and second p-type base regions 3a and 4a, an $n^+$ source region 5, a $p^+$ contact region 6a, an n-type junction FET (JFET) region 7, a gate insulating film 8, and a gate electrode 9.

The first p-type base region 3a is selectively formed in the surface layer of the $n^-$ silicon carbide layer 31 on the p-type silicon carbide layer 32 side (that is, on the substrate front surface side). Forming the first p-type base region 3a in an epitaxial growth layer (the n⁻ silicon carbide layer 31) produces a channel with desirable crystalline properties, and the high resulting carrier mobility makes it possible to achieve low on-resistance. The impurity concentration of the first p-type base region 3a may be $3 \times 10^{17}/cm^3$ to $3 \times 10^{18}/cm^3$, for example. The portion of the n⁻ silicon carbide layer 31 other than the first p-type base region 3a is the n⁻ drift region 2. The n⁺ source region 5, the p⁺ contact region 6a, and the n-type JFET region 7 are respectively formed selectively within the p-type silicon carbide layer 32. The n⁺ source region 5 and the p⁺ contact region 6a face the first p-type base region 3a in the depth direction (the vertical direction).

The n⁺ source region 5 and the p⁺ contact region 6a contact one another. The p⁺ contact region 6a may go through the p-type silicon carbide layer 32 in the depth direction and reach the first p-type base region 3a. The impurity concentration of the p⁺ contact region 6a should be set to a value that makes it possible to form ohmic contact (an electrical junction) with a source electrode 12, such as approximately $1 \times 10^{20}/cm^3$. The n-type JFET region 7 is arranged separated from the n⁺ source region 5 on the side of the p⁺ contact region 6a opposite to the n⁺ source region 5. The n-type JFET region 7 is formed by inverting a portion of the p-type silicon carbide layer 32 to n-type using an ion implantation process and goes through the p-type silicon carbide layer 32 in the depth direction to reach the n⁻ drift region 2. The n-type JFET region 7 functions as a drift region.

The portion of the p-type silicon carbide layer 32 other than the n⁺ source region 5, the p⁺ contact region 6a, and the n-type JFET region 7 is the second p-type base region 4a. The impurity concentration of the second p-type base region 4a may be set to any value lower than the impurity concentration of the first p-type base region 3a and may thus be set to approximately $3 \times 10^{15}/cm^3$ to approximately $3 \times 10^{16}/cm^3$, for example. The planar layout of the first and second p-type base regions 3a and 4a, the n⁺ source region 5, the p⁺ contact region 6a, and the n-type JFET region 7 will be described later. The gate insulating film 8 is formed, spanning from the n⁺ source region 5 to the surface of the n-type JFET region 7, on the surface of the portion of the second p-type base region 4a that is sandwiched between the n⁺ source region 5 and the n-type JFET region 7. The gate electrode 9 is formed on the gate insulating film 8.

The region from the widthwise center of one n-type JFET region 7 to the widthwise center of another n-type JFET region 7 that is adjacent to that one n-type JFET region 7 corresponds to one inner peripheral cell 24a. Here, the width of each n-type JFET region 7 is equal to the distance between adjacent second p-type base regions 4a. An interlayer insulating film 11 is formed spanning over the entire substrate front surface from the active region 21 to the edge termination region 22 and covering the gate electrode 9. The source electrode 12 contacts the n⁺ source region 5 and the p⁺ contact region 6a via a contact hole formed in the interlayer insulating film 11 and is electrically insulated from the gate electrode 9 by the interlayer insulating film 11. A drain electrode 13 is formed spanning over the entire rear surface of the silicon carbide substrate 10 (that is, the rear surface of the n⁺ starting substrate 1).

First and second p-type base regions 3b and 4b that have the same configuration as the first and second p-type base regions 3a and 4a in the active region 21 are arranged on the front surface side of the silicon carbide substrate 10 in a region (hereinafter, "boundary region") 23 between the active region 21 and the edge termination region 22. The first and second p-type base regions 3b and 4b face the first and second p-type base regions 3a and 4a in the active region 21 with the outermost n-type JFET region 7 sandwiched therebetween. The first and second p-type base regions 3b and 4b in the boundary region 23 extend into the edge termination region 22. A p⁺ contact region 6b is selectively formed, separated from the n-type JFET region 7, within the second p-type base region 4b in the boundary region 23. The impurity concentration of the p⁺ contact region 6b is substantially equal to the impurity concentration of the p⁺ contact region 6a of the inner peripheral cell 24a.

The p⁺ contact region 6b in the boundary region 23 extracts, to the source electrode 12, holes that accumulate near the boundary between the n⁻ drift region 2 and the first p-type base region 3b while the MOSFET is OFF. Therefore, forming the p⁺ contact region 6b in the boundary region 23 makes it possible to, while the MOSFET is OFF, reduce the current that flows from the substrate rear surface in the edge termination region 22 to the first p-type base region 3b as well as prevent current that flows inwards from the substrate rear surface in the edge termination region 22 from flowing into the active region 21. No n⁺ source region is formed within the second p-type base region 4b in the boundary region 23. The outermost gate insulating film 8 and gate electrode 9 extend onto the surface of the second p-type base region 4b in the boundary region 23.

The portion from the widthwise center of the outermost JFET region 7 to a prescribed distance on the outer side (a length d2 (described later)) corresponds to one unit cell (outermost peripheral cell) 24b in the boundary region 23. The outermost peripheral cell 24b includes the first and second p-type base regions 3b and 4b and the p⁺ contact region 6b in the boundary region 23. The planar layout of the first and second p-type base regions 3b and 4b and the p⁺ contact region 6b in the boundary region 23 will be described later. The outermost gate insulating film 8 and gate electrode 9 may extend from the active region 21 into the boundary region 23. The source electrode 12 extends from the active region 21 into the boundary region 23 and contacts the second p-type base region 4b and the p⁺ contact region 6b in the boundary region 23. The end of the source electrode 12 is terminated on the interlayer insulating film 11 at a position further outwards than the p⁺ contact region 6b in the boundary region 23.

The p-type silicon carbide layer 32 is removed across the entire edge termination region 22 to form a level difference 41 that is lower than the active region 21 and the boundary region 23 (thus receding towards the drain side) in the front surface of the silicon carbide substrate 10 in the edge termination region 22. In other words, the n⁻ silicon carbide layer 31 is exposed on the substrate front surface in the edge termination region 22. A prescribed thickness may be removed from the surface layer of the n⁻ silicon carbide layer 31 that is exposed on the substrate front surface by the level difference 41 relative to the boundary region 23. The connecting portion (hereinafter, the "stair in the level difference 41") 41a between (the upper level and lower level of) the substrate front surface in the boundary region 23 and the edge termination region 22 may be slanted or substantially orthogonal relative to the substrate front surface.

The first p-type base region 3b in the boundary region 23 (or the first and second p-type base regions 3b and 4b in the boundary region 23) is exposed along the stair 41a in the level difference 41. The second p-type base region 4b in the boundary region 23 is exposed along the surface layer of the n⁻ silicon carbide layer 31 that is exposed on the substrate front surface by the level difference 41 relative to the boundary region 23. Here, "exposed" means arranged contacting the interlayer insulating film 11 on the substrate front surface. Moreover, a voltage withstand structure such as a junction termination extension (JTE) structure is formed in the n⁻ silicon carbide layer 31 that is exposed on the substrate front surface by the level difference 41 relative to the boundary region 23, for example.

The JTE structure includes a plurality of p-type regions (here, two regions: first and second JTE regions 42 and 43) arranged adjacent to one another in a concentric circle pattern surrounding the periphery of the active region 21, with the regions arranged further outwards having increasingly lower impurity concentrations. The first JTE region (a p⁻ region) 42 is formed on the innermost side of the edge termination region 22 and contacts the first p-type base region 3b in the boundary region 23. The second JTE region (a p⁻ region) 43 is formed further outwards than the first JTE region 42 and contacts the first JTE region 42. The voltage withstand structure is not limited to this example and may be modified in various ways. For example, instead of a JTE structure, a voltage withstand structure that includes a combination of components such as a guard ring, a field plate, and a RESURF portion may be arranged.

Next, the planar layout of the components in the inner peripheral cell 24a and the outermost peripheral cell 24b will be described. As illustrated in FIG. 2, a plurality of the inner peripheral cells 24a are arranged in a matrix-like planar layout. A plurality of the outermost peripheral cells 24b are arranged contacting one another in a planar layout that runs along the outer periphery of the active region 21 and surrounds the periphery of the active region 21. FIG. 2 only illustrates three of the inner peripheral cells 24a among the inner peripheral cells 24a arranged on the outermost side and does not show the inner peripheral cells 24a arranged further inwards than those inner peripheral cells 24a nor the other inner peripheral cells 24a arranged on the outermost side (this also applies to FIGS. 3 and 5). The inner peripheral cells 24a have a planar shape such as a substantially equilateral hexagon shape, a substantially rectangular shape, or a substantially circular shape, for example. In FIG. 2, the inner peripheral cells 24a and the outermost peripheral cells 24b have a substantially equilateral hexagon-shaped planar shape, with the external shapes thereof illustrated by dashed lines (this also applies to FIGS. 3 and 5).

More specifically, the inner peripheral cells 24a are arranged adjacent to one another with no gaps therebetween in the active region 21 (that is, in a honeycomb pattern). Each p⁺ contact region 6a has a substantially equilateral hexagon-shaped planar shape and is arranged at the substantially center portion of the respective inner peripheral cell 24a. Each n⁺ source region 5, second p-type base region 4a, and n-type JFET region 7 are arranged in that order in the direction going from the p⁺ contact region 6a side away from the p⁺ contact region 6a and have a substantially equilateral hexagon shape that surrounds the periphery of the respective p⁺ contact region 6a. Adjacent inner peripheral cells 24a contact one another along one side on which the respective n-type JFET regions 7 are adjacent to one another. The first p-type base regions 3a (not illustrated in the figure) have substantially equilateral hexagon-shaped planar shapes of substantially the same size as the second p-type base regions 4a and are arranged on the drain side of the second p-type base regions 4a (that is, on the side going into the page in the figure).

The outermost peripheral cells 24b have the same planar shape as the inner peripheral cells 24a. The diagonal length (or diameter if the outermost peripheral cells 24b have a circular planar shape) d2 of the outermost peripheral cells 24b is the same as the diagonal length d1 of the inner peripheral cells 24a. In other words, the area parallel to the substrate front surface (that is, the area when viewed in a plan view; hereinafter, the "surface area") of each outermost peripheral cell 24b is equal to the surface area of each inner peripheral cell 24a. The outermost peripheral cells 24b are arranged in a line with no gaps therebetween in the boundary region 23 and in a continuous manner with the outermost inner peripheral cells 24a. In other words, base contacts (the p⁺ contact regions 6a and 6b) spanning from the active region 21 to the boundary region 23 are arranged separated from one another at equal intervals.

More specifically, each p⁺ contact region 6b has a substantially equilateral hexagon-shaped planar shape and is arranged at the substantially center portion of the respective outermost peripheral cell 24b. The diagonal length d4 of the p⁺ contact regions 6b is less than the diagonal length d3 of the p⁺ contact regions 6a of the inner peripheral cells 24a. In other words, the resistance of the p⁺ contact regions 6b of the outermost peripheral cells 24b is greater than the resistance of the p⁺ contact regions 6a of the inner peripheral cells 24a. Here, the surface area S2 of the p⁺ contact regions 6b is less than the surface area S1 of the p⁺ contact regions 6a of the inner peripheral cells 24a, and it is preferable that these surface areas satisfy formula (1) below. The reasons for this are as follows.

As described above, the p⁺ contact regions 6b of the outermost peripheral cells 24b extract holes to the source electrode 12 while the MOSFET is OFF. Therefore, the smaller the surface area of the p⁺ contact regions 6b is relative to the surface area of the outermost peripheral cells 24b, the weaker the hole extraction effect of the p⁺ contact regions 6b. If S2<0.5·S1, the weakness of the resulting hole extraction effect of the p⁺ contact regions 6b increases the reverse recovery time of parasitic diodes in which the p⁺ contact regions 6b and the first p-type base regions 3b of the outermost peripheral cells 24b are the anodes and the n⁻ drift region 2 is the cathode (hereinafter, simply "parasitic diodes"). This causes various problems such as reduced switching speed and increased switching loss. Meanwhile, if 0.9·S1<S2, the resulting reduction in the incidence of recombination of electron-hole pairs (described below) in the portions directly beneath the p⁺ contact regions 6b of the outermost peripheral cells 24b is too low.

$$0.5 \cdot S1 \leq S2 \leq 0.9 \cdot S1 \quad (1)$$

The second p-type base regions 4b each have a substantially equilateral hexagon shape that surrounds the periphery of the respective p⁺ contact region 6b. The first p-type base regions 3b (not illustrated in the figure) have substantially equilateral hexagon-shaped planar shapes of substantially the same size as the second p-type base regions 4b and are arranged on the drain side of the second p-type base regions 4b (that is, on the side going into the page in the figure). The n-type JFET regions 7 are arranged along the two sides of each outermost peripheral cell 24b that contact the adjacent inner peripheral cells 24a, thus surrounding the inner sides of the second p-type base regions 4b. In other words, each outermost peripheral cell 24b contacts each of the adjacent inner peripheral cells 24a along one side on which the respective n-type JFET regions 7 are adjacent to one another. Moreover, adjacent outermost peripheral cells 24b contact one another along one side on which the respective second p-type base regions 4b are adjacent to one another.

Next, the operation of the silicon carbide semiconductor device according to Embodiment 1 and illustrated in FIGS. 1 and 2 will be described using a conventional MOSFET as well as the MOSFET according to Comparison Example 1 and illustrated in FIG. 3. The MOSFET according to Comparison Example 1 and illustrated in FIG. 3 is different from the silicon carbide semiconductor device according to Embodiment 1 in that the diagonal length d5 of the outermost peripheral cells 24b is greater than the diagonal length d3 of the p+ contact regions 6a of the inner peripheral cells 24a. In other words, in the MOSFET according to Comparison Example 1, the surface area of p+ contact regions 6c of the outermost peripheral cells 24b is greater than the surface area of the p+ contact regions 6a of the inner peripheral cells 24a. Moreover, the conventional MOSFET is an n-channel MOSFET that has the same configuration as one of the inner peripheral cells 24a of the silicon carbide semiconductor device according to Embodiment 1.

In the conventional MOSFET, a positive voltage relative to the source electrode is applied to the drain electrode. In this state, when a voltage of greater than or equal to the threshold voltage is applied to the gate electrode, an n-type inversion layer (channel) is formed in the surface region of the p-type base region that is directly beneath the gate electrode (that is, in the portion that faces the gate electrode with the gate insulating film sandwiched therebetween). This allows a primary current to flow along a path formed by the n+ semiconductor substrate, the n-type drift region, the inversion layer in the surface of the p-type base region, and the n+ source region. This state is the ON state of the MOSFET. Meanwhile, when a voltage of less than the threshold voltage is applied to the gate electrode, the p-n junction between the p-type base region and the n-type drift region becomes reverse-biased, and therefore the primary current does not flow. In other words, the MOSFET remains in the OFF state.

While the MOSFET is OFF, a parasitic diode present on the current path in the MOSFET conducts current in the forward direction, thus causing a parasitic NPN bipolar transistor in which the n+ source region is the emitter, the p-type base region is the base, the n-type drift region is the collector, and the forward current in the parasitic diode is the base current to operate. Here, the "parasitic diode present on the current path in the MOSFET" refers to a diode in which the p+ contact region and the p-type base region are the anode and the n− drift region is the cathode. As illustrated in FIG. 4, while the parasitic NPN bipolar transistor is operating, the incidence of recombination of electron-hole pairs in the silicon carbide substrate (semiconductor chip) is greatest in the p-type base region 53. Note that here the reference characters 51 and 52 respectively indicate the n+ starting substrate and the n-type drift region.

Therefore, when base contacts (the p+ contact regions 6c) that have a larger surface area than other base contacts (the p+ contact regions 6a) are present in the silicon carbide substrate, as in the MOSFET according to Comparison Example 1 and illustrated in FIG. 3, the current density in the portions directly beneath (on the drain side of) those base contacts of larger surface area is higher. In this case, the incidence of recombination of electron-hole pairs is greater in the portions directly beneath the p+ contact regions 6c of the outermost peripheral cells 24b than in the portions directly beneath the p+ contact regions 6a of the inner peripheral cells 24a, thereby making any basal plane dislocations in the n+ starting substrate 51 more prone to developing into stacking faults in those portions directly beneath the p+ contact regions 6c of the outermost peripheral cells 24b. Therefore, the design requirements for the device become determined by the structure of the outermost peripheral cells 24b in the boundary region 23.

However, in the present invention as described above, the surface area S2 of the p+ contact regions 6b of the outermost peripheral cells 24b is less than the surface area S1 of the p+ contact regions 6a of the inner peripheral cells 24a. Therefore, the incidence of recombination of electron-hole pairs is greater in the portions directly beneath the p+ contact regions 6a of the inner peripheral cells 24a than in the portions directly beneath the p+ contact regions 6b of the outermost peripheral cells 24b. As a result, any basal plane dislocations in the n+ starting substrate 1 are more prone to developing into stacking faults in those portions directly beneath the p+ contact regions 6a of the inner peripheral cells 24a. This makes it possible for the design requirements for the device to be determined by the structure of the inner peripheral cells 24a in the active region 21, which occupies a large surface area relative to the overall chip area and thus has a greater impact on overall device performance.

Next, a method of manufacturing the silicon carbide semiconductor device according to Embodiment 1 will be described. First, the n+ starting substrate (starting wafer) 1 that will become the n+ drain region is prepared. An n+ monocrystalline substrate with a diameter of 3 inches and made of nitrogen (N)-doped 4H-SiC (the period of four-layer hexagonal form) may be used for the n+ starting substrate 1, for example. The front surface of the n+ starting substrate 1 may be a (0001) plane having an off-angle of approximately 4° in the <11-20> direction (the so-called Si plane), for example. Next, the n− silicon carbide layer 31 (which is doped with n-type impurities such as nitrogen, for example) is epitaxially grown on the front surface of the n+ starting substrate 1. The impurity concentration and thickness of the n− silicon carbide layer 31 may respectively be approximately $1 \times 10^{16}/cm^3$ and approximately 10 µm, for example.

Then, using an ion implantation process with p-type impurities such as aluminum (Al), for example, the first p-type base regions 3a and 3b are selectively formed in the surface layer of the n− silicon carbide layer 31. The impurity concentration of the first p-type base regions 3a and 3b may be approximately $1 \times 10^{18}/cm^3$, for example. The portion of the n− silicon carbide layer 31 other than the first p-type base regions 3a and 3b becomes the n− drift region 2. Next, the p-type silicon carbide layer 32 (which is doped with p-type impurities such as aluminum, for example) is epitaxially grown on the surface of the n− silicon carbide layer 31. The impurity concentration and thickness of the p-type silicon carbide layer 32 may respectively be approximately $1 \times 10^{16}/cm^3$ and approximately 0.5 µm, for example. The steps thus far produce the silicon carbide substrate (semiconductor wafer) 10 in which the n− silicon carbide layer 31 and the p-type silicon carbide layer 32 are layered in order on the front surface of the n+ starting substrate 1.

Next, using an etching process, the p-type silicon carbide layer 32 is removed across the entire edge termination region 22. A small amount of the surface layer of the n− silicon carbide layer 31 may be removed along with the p-type silicon carbide layer 32 at this time. This forms the level difference 41 that is lower than the boundary region 23 in the front surface of the silicon carbide substrate 10 in the edge termination region 22, thereby exposing the n− silicon carbide layer 31 on the substrate front surface in the edge termination region 22. A portion of the n− silicon carbide layer 31 having a width (that is, width in the direction going from the inner side towards the outer side) that still allows the outermost peripheral cells 24b to be formed should remain in the boundary region 23, and the p-type silicon carbide layer 32 may be removed right up to the periphery of the boundary region 23 when removing the p-type silicon carbide layer 32 across the entire edge termination region 22.

Next, an ion implantation process is repeated under different conditions to selectively form the n$^+$ source regions 5, the p$^+$ contact regions 6a and 6b, the n-type JFET regions 7, and the first and second JTE regions 42 and 43 in prescribed planar shapes. The p$^+$ contact regions 6a and 6b are formed in substantially equilateral hexagon-shaped planar shapes, for example. The impurity concentration of the p$^+$ contact regions 6a and 6b may be approximately 1×10$^{20}$/cm$^3$, for example. The diagonal length d3 of the p$^+$ contact regions 6a is approximately 2 μm, and the diagonal length d4 of the p$^+$ contact regions 6b is approximately 1 μm, for example. The p$^+$ contact regions 6a and 6b may be formed at the same time.

The n$^+$ source regions 5 are formed in substantially equilateral hexagon-shaped planar shapes respectively surrounding the peripheries of the p$^+$ contact regions 6a, for example. The n-type JFET regions 7 are formed in substantially equilateral hexagon-shaped planar shapes separated from the n$^+$ source regions 5 and respectively surrounding the peripheries of the n$^+$ source regions 5, for example. The order in which the n$^+$ source regions 5, the p$^+$ contact regions 6a and 6b, the n-type JFET regions 7, and the first and second JTE regions 42 and 43 are formed may be changed. The portions of the p-type silicon carbide layer 32 other than the n$^+$ source regions 5, the p$^+$ contact regions 6a and 6b, and the n-type JFET regions 7 become the second p-type base regions 4a and 4b. The diagonal length d1 of the inner peripheral cells 24a and the diagonal length d2 of the outermost peripheral cells 24b are approximately 12 μm, for example.

Next, a heat treatment (activation annealing) is performed to activate all of the regions formed via ion implantation. Alternatively, an activation annealing process may be performed after each ion implantation process. Then, the gate insulating film 8 is formed on the front surface of the silicon carbide substrate 10 (the surface of the p-type silicon carbide layer 32). Phosphorus-doped polysilicon (poly-Si), for example, is then deposited on the gate insulating film 8 and patterned to leave the polysilicon remaining in portions that will be the gate electrodes 9. Next, the interlayer insulating film 11 is formed over the entire front surface of the silicon carbide substrate 10, thus covering the gate electrodes 9. Then, the interlayer insulating film 11 and the gate insulating film 8 are patterned to form contact holes, thereby exposing the n$^+$ source regions 5, the p$^+$ contact regions 6a and 6b, and the second p-type base regions 4b.

Next, the interlayer insulating film 11 is planarized using a heat treatment. Then, the source electrode 12 is formed on the interlayer insulating film 11 to fill in the contact holes and is then patterned. Next, the drain electrode 13 is formed on the rear surface of the silicon carbide substrate 10 (the rear surface of the n$^+$ starting substrate 1). Finally, the semiconductor wafer is diced into individual chips, thus completing the silicon carbide semiconductor device illustrated in FIGS. 1 and 2. In the method of manufacturing the silicon carbide semiconductor device according to Embodiment 1, the masks used in the ion implantation and etching processes may be resist masks or oxide film masks, for example.

Working Example 1

Next, the silicon carbide semiconductor device according to Embodiment 1 was tested for formation of stacking faults. First, following the method of manufacturing the silicon carbide semiconductor device according to Embodiment 1 as described above, a MOSFET of the type illustrated in FIGS. 1 and 2 was produced using the conditions described above (Working Example 1). Then, a current yielding a current density of 2500 A/cm$^2$ was passed in the forward direction through parasitic diodes in the inner peripheral cells 24a of Working Example 1 in which the p$^+$ contact regions 6a and the first p-type base regions 3a are the anodes and the n$^-$ drift region 2 is the cathode (hereinafter, simply "the parasitic diodes"). Moreover, a current yielding the same current density as in Working Example 1 was passed in the forward direction through the parasitic diodes in the inner peripheral cells 24a of the MOSFET according to Comparison Example 1 and illustrated in FIG. 3.

As a result, it was confirmed that when the surface area of the p$^+$ contact regions 6c of the outermost peripheral cells 24b is greater than the surface area of the p$^+$ contact regions 6a of the inner peripheral cells 24a, as in Comparison Example 1 as illustrated in FIG. 3, stacking faults starting from basal plane dislocations in the n$^+$ starting substrate 1 expand into the portions directly beneath the p$^+$ contact regions 6c of the outermost peripheral cells 24b. In contrast, it was also confirmed that when the surface area of the p$^+$ contact regions 6b of the outermost peripheral cells 24b is less than the surface area of the p$^+$ contact regions 6a of the inner peripheral cells 24a, as in Working Example 1, stacking faults starting from basal plane dislocations in the n$^+$ starting substrate 1 do not form in the portions directly beneath the p$^+$ contact regions 6b of the outermost peripheral cells 24b.

In Embodiment 1 as described above, making the surface area of the p$^+$ contact regions of the outermost peripheral cells less than the surface area of the p$^+$ contact regions of the inner peripheral cells makes the resistance of the p$^+$ contact regions of the outermost peripheral cells greater than the resistance of the p$^+$ contact regions of the inner peripheral cells. This makes it possible to reduce current concentration in the portions directly beneath the p$^+$ contact regions of the outermost peripheral cells when the MOSFET is switched OFF and the parasitic diodes turn on. This, in turn, makes it possible to reduce the incidence of recombination of electron-hole pairs in the portions directly beneath the p$^+$ contact regions of the outermost peripheral cells, thereby making it possible to inhibit formation of stacking faults in the boundary region. In this way, formation of stacking faults can be inhibited by controlling how easily the stacking faults form in the cell structure of the inner cells (which occupy a large area on the chip). Depending on the design requirements for the inner cells, this can even make it possible to provide a MOSFET in which stacking faults do not form at all, for example.

Moreover, in Embodiment 1, no regions that do not conduct current when the MOSFET is ON (such as the current-limiting regions or the fault stop regions in the patent documents described above) are formed within the active region, and therefore the current carrying capability of the MOSFET is not reduced. In other words, this makes it possible to provide a MOSFET in which the current carrying capability is maintained and the formation of stacking faults is inhibited. This, in turn, makes it possible to prevent increases in conduction loss in a power module equipped with the silicon carbide semiconductor device according to Embodiment 1. Here, "power module" refers to a power module used in the main circuit in an inverter or an intelligent power module (IPM) for use in vehicles or railways, for example. Furthermore, Embodiment 1 only requires modifying the planar dimensions of the $p^+$ contact regions of the outermost peripheral cells, thereby making it possible to use the same methods of manufacturing silicon carbide semiconductor devices as in conventional technologies.

Embodiment 2

Figure 5:
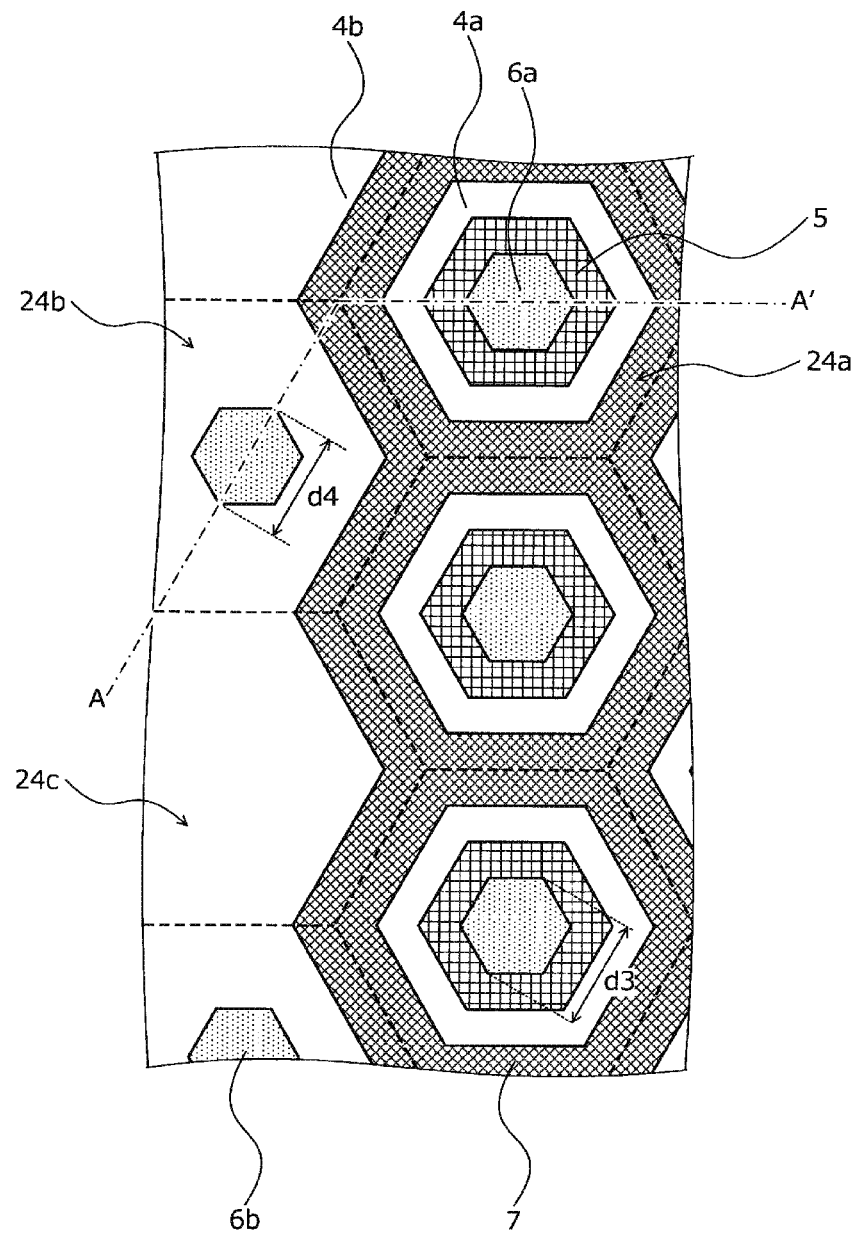
FIG. 5 is a plan view illustrating the planar layout of the primary components of a silicon carbide semiconductor device according to Embodiment 2.

Next, the structure of a silicon carbide semiconductor device according to Embodiment 2 will be described. FIG. 5 is a plan view illustrating the planar layout of the primary components of the silicon carbide semiconductor device according to Embodiment 2. The cross-sectional structure as taken along line A-A' in FIG. 5 is the same as in FIG. 1. The silicon carbide semiconductor device according to Embodiment 2 is different from the silicon carbide semiconductor device according to Embodiment 1 in that the cell density of the outermost peripheral cells 24b is reduced. In other words, the outermost peripheral cells 24b are culled and are arranged at a prescribed interval within the boundary region 23. Here, "culling the outermost peripheral cells 24b" refers to arranging, between the outermost peripheral cells 24b, one or more regions (hereinafter, "open regions") 24c that have the same surface area as the outermost peripheral cells 24b but do not include $p^+$ contact regions 6b.

The second p-type base regions 4b from the adjacent outermost peripheral cells 24b extend into the open regions 24c. Here, as long as the total surface area (area density) S12 of the $p^+$ contact regions 6b arranged in the boundary region 23 remains less than the total surface area (area density) S11 of the $p^+$ contact regions 6a of the inner peripheral cells 24a arranged in the active region 21, the surface area of the individual $p^+$ contact regions 6b of the outermost peripheral cells 24b may be modified in various ways. FIG. 5 illustrates a case in which the surface area of the $p^+$ contact regions 6b of the outermost peripheral cells 24b is set to be equal to the surface area of the $p^+$ contact regions 6a of the inner peripheral cells 24a (that is, d4=d3).

It is preferable that the total surface area S12 of the $p^+$ contact regions 6b arranged in the boundary region 23 satisfy formula (2) below. The reasons for this are as follows. The smaller the total surface area S12 of the $p^+$ contact regions 6b is relative to the surface area of the boundary region 23, the weaker the hole extraction effect of the $p^+$ contact regions 6b. If S12<0.5·S11, the weakness of the resulting hole extraction effect of the $p^+$ contact regions 6b increases the reverse recovery time of the parasitic diodes in the outermost peripheral cells 24b, which causes various problems such as reduced switching speed and increased switching loss. Meanwhile, if 0.9·S11<S12, the resulting reduction in the incidence of recombination of electron-hole pairs in the portions directly beneath the $p^+$ contact regions 6b of the outermost peripheral cells 24b is too low.

$$0.5 \cdot S11 \leq S12 \leq 0.9 \cdot S11 \quad (2)$$

In a method of manufacturing the silicon carbide semiconductor device according to Embodiment 2, the ion implantation masks used in the method of manufacturing the silicon carbide semiconductor device according to Embodiment 1 should be modified such that the area density of the $p^+$ contact regions 6b formed in the boundary region 23 is less than the area density of the $p^+$ contact regions 6a of the inner peripheral cells 24a formed in the active region 21.

Working Example 2

Next, the silicon carbide semiconductor device according to Embodiment 2 was tested for formation of stacking faults. First, following the method of manufacturing the silicon carbide semiconductor device according to Embodiment 2 as described above, a MOSFET of the type illustrated in FIG. 5 was produced using the conditions described above (Working Example 2). Then, a current yielding a current density of 2500 A/cm² was passed in the forward direction through the parasitic diodes in the inner peripheral cells 24a of Working Example 2. In this way, it was confirmed in Working Example 2 that similar to in Working Example 1, stacking faults starting from basal plane dislocations in the $n^+$ starting substrate 1 did not form in the portions directly beneath the $p^+$ contact regions 6b of the outermost peripheral cells 24b.

In Embodiment 2 as described above, reducing the cell density of the outermost peripheral cells effectively increases the resistance of the $p^+$ contact regions in the outermost peripheral cells, thereby making it possible to achieve the same advantageous effects as in Embodiment 1.

Embodiment 3

Figure 6:
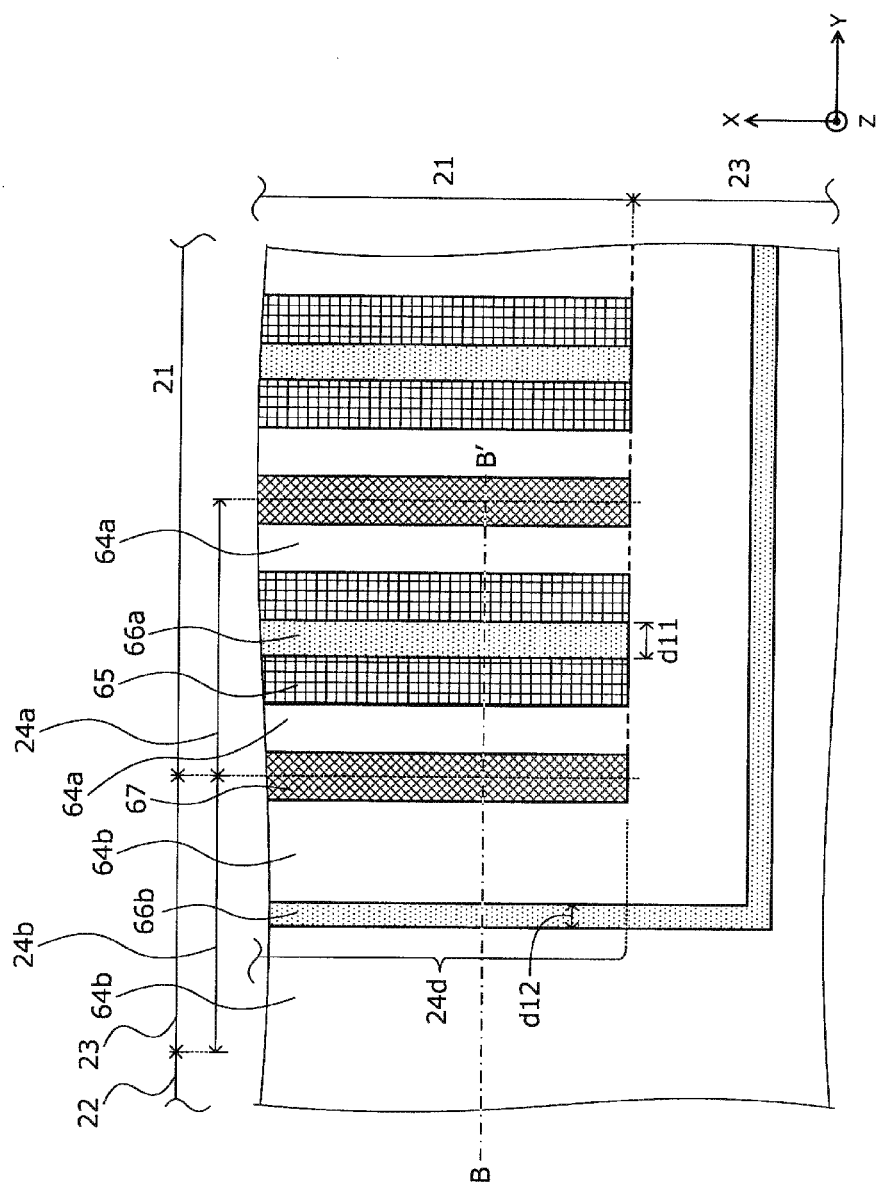
FIG. 6 is a plan view illustrating the planar layout of the primary components of a silicon carbide semiconductor device according to Embodiment 3.

Next, the structure of a silicon carbide semiconductor device according to Embodiment 3 will be described. FIG. 6 is a plan view illustrating the planar layout of the primary components of the silicon carbide semiconductor device according to Embodiment 3. The cross-sectional structure taken along line B-B' in FIG. 6 is the same as in FIG. 1 except in that the reference characters 4a, 4b, 5, 6a, 6b, 7, d3, and d4 in FIG. 1 are replaced with 64a, 64b, 65, 66a, 66b, 67, d11, and d12. The silicon carbide semiconductor device according to Embodiment 3 is different from the silicon carbide semiconductor device according to Embodiment 1 in that the components of inner peripheral cells 24a are arranged in a stripe-shaped planar layout extending in the same direction (hereinafter, a "first direction") X and in that a $p^+$ contact region 66b of an outermost peripheral cell 24b is arranged in a planar layout that includes a straight portion extending in the first direction X.

More specifically, a $p^+$ contact region 66a, $n^+$ source regions 65, second p-type base regions 64a, and n-type JFET regions 67 of each of the inner peripheral cells 24a each have a substantially straight line-shaped planar shape that extends in the first direction X. The ends of the $p^+$ contact region 66a, the $n^+$ source regions 65, the second p-type base regions 64a, and the n-type JFET regions 67 in the first direction X end at the boundary between an active region 21 and a boundary region 23, for example. The $p^+$ contact region 66a is arranged at the substantially center portion of the inner peripheral cell 24a. The $n^+$ source regions 65 are arranged on both sides of the $p^+$ contact region 66a in a direction (hereinafter, a "second direction") Y that is orthogonal to the first direction X and is parallel to the substrate front surface.

The second p-type base regions 64a are arranged on both sides of the $p^+$ contact region 66a in the second direction Y such that the $n^+$ source regions 65 are sandwiched between the second p-type base regions 64a and the $p^+$ contact region 66a. A first p-type base region (not illustrated in the figure) of the inner peripheral cell 24a has a substantially rectangular planar shape of the same size as the $p^+$ contact region 66a, the n⁺ source regions 65, and the second p-type base regions 64a combined and is arranged on the drain side of these regions (that is, on the side going into the page in the figure). The n-type JFET regions 67 are arranged on both sides of the p⁺ contact region 66a in the second direction Y such that the n⁺ source regions 65 and the second p-type base regions 64a are sandwiched between the n-type JFET regions 67 and the p⁺ contact region 66a.

The region from the widthwise center (widthwise in the second direction Y) of one n-type JFET region 67 to the widthwise center of another n-type JFET region 67 that is adjacent to that one n-type JFET region 67 corresponds to one inner peripheral cell 24a. The inner peripheral cells 24a are arranged adjacent to one another in the second direction Y. Adjacent inner peripheral cells 24a contact one another along adjacent n-type JFET regions 67. A gate insulating film (not illustrated in the figure) is arranged, spanning from the n-type JFET regions 67 to the n⁺ source regions 65, on the surfaces of the portions of the second p-type base regions 64a that are sandwiched between the n-type JFET regions 67 and the n⁺ source regions 65. A gate electrode (not illustrated in the figure) is arranged on the gate insulating film and has a substantially straight line-shaped planar shape that extends in the first direction X. The reference character Z indicates the depth direction of the silicon carbide substrate 10.

The outermost peripheral cell 24b is arranged in a planar layout that includes a straight portion extending in the first direction X. More specifically, the outermost peripheral cell 24b is arranged in a substantially rectangular planar layout that surrounds the periphery of the active region 21, for example. A second p-type base region 64b and the p⁺ contact region 66b of the outermost peripheral cell 24b have a rectangular planar shape (hereinafter, a "substantially rectangular frame-shaped planar shape") that runs along the outer periphery of the active region 21, and that surrounds the periphery of the active region 21. The p⁺ contact region 66b is separated from the active region 21. The second p-type base region 64b contacts the n-type JFET region 67 that is positioned on the outermost side in the second direction Y and contacts the first direction X-side ends of the each of the components of the inner peripheral cells 24a in the first direction X. In FIG. 6, the dashed lines indicate the boundaries between the second p-type base region 64b and the second p-type base regions 64a of the inner peripheral cells 24a (this also applies to FIGS. 7 and 8). A first p-type base region (not illustrated in the figure) of the outermost peripheral cell 24b has a substantially rectangular planar shape of the same size as the p⁺ contact region 66b and the second p-type base region 64b combined and is arranged on the drain side of these regions (that is, on the side going into the page in the figure).

The p⁺ contact region 66b is arranged separated from the boundary between the active region 21 and the boundary region 23. The width d12 of the p⁺ contact region 66b is less than the width (width in the second direction Y) d11 of the p⁺ contact regions 66a of the inner peripheral cells 24a. In other words, the surface area of a portion 24d of the p⁺ contact region 66b that faces the inner peripheral cells 24a in the second direction Y is less than the surface area of the p⁺ contact regions 66a of the inner peripheral cells 24a. Here, the "portion 24d of the p⁺ contact region 66b that faces the inner peripheral cells 24a in the second direction Y" refers to the portion of the p⁺ contact region 66b that is parallel to the first direction X and has the same length (length in the first direction X) as the p⁺ contact regions 66a of the inner peripheral cells 24a.

It is preferable that the width d12 of the p⁺ contact region 66b satisfy formula (3) below. The reasons for this are as follows. The smaller the width d12 of the p⁺ contact region 66b is, the smaller the surface area of the p⁺ contact region 66b is relative to the surface area of the boundary region 23, and therefore the weaker the hole extraction effect of the p⁺ contact region 66b is. If d12<0.5·d11, the weakness of the resulting hole extraction effect of the p⁺ contact region 66b increases the reverse recovery time of the parasitic diode in the outermost peripheral cell 24b, which causes various problems such as reduced switching speed and increased switching loss. Meanwhile, if 0.9·d11<d12, the resulting reduction in the incidence of recombination of electron-hole pairs in the portion directly beneath the p⁺ contact region 66b of the outermost peripheral cell 24b is too low.

$$0.5 \cdot d11 \leq d12 \leq 0.9 \cdot d11 \qquad (3)$$

In a method of manufacturing the silicon carbide semiconductor device according to Embodiment 3, the ion implantation masks used in the method of manufacturing the silicon carbide semiconductor device according to Embodiment 1 should be modified as needed in order to form the components of the inner peripheral cells 24a and the p⁺ contact region 66b of the outermost peripheral cell 24b.

Working Example 3

Figure 7:
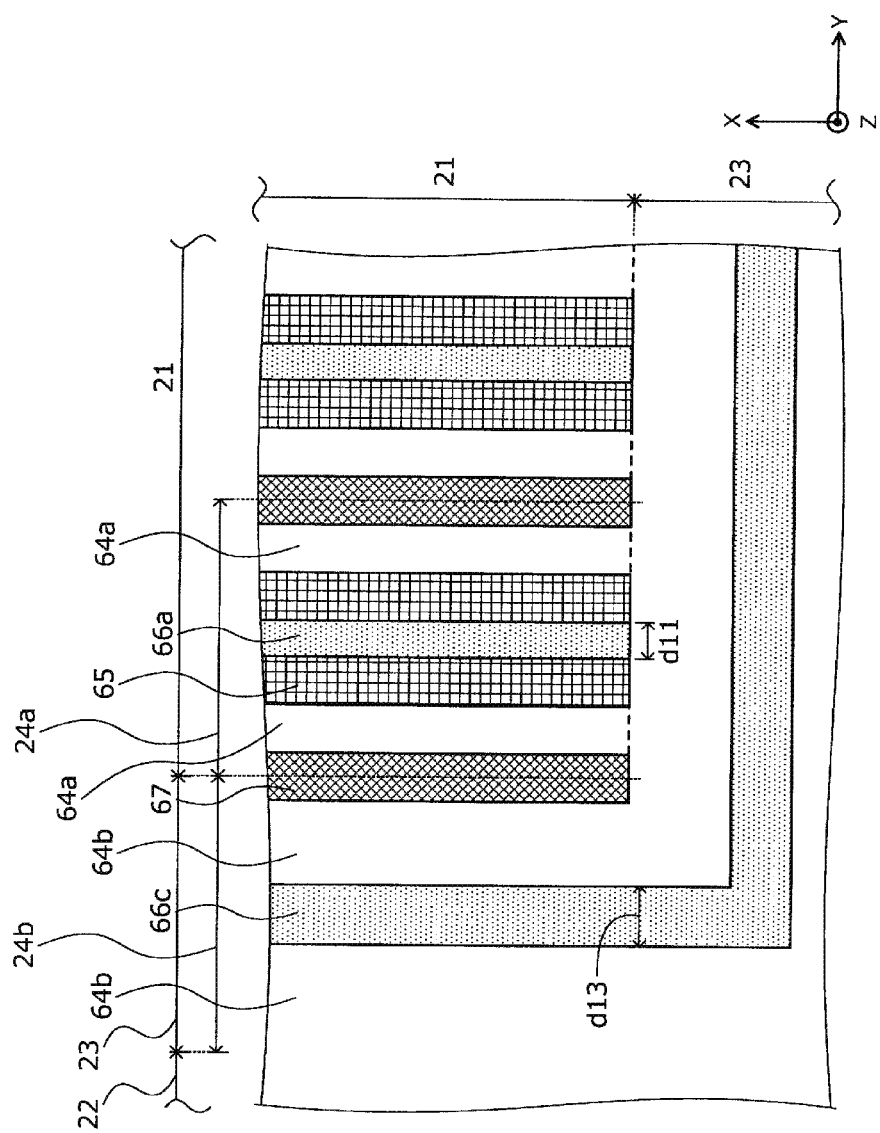
FIG. 7 is a plan view illustrating the planar layout of a silicon carbide semiconductor device according to Comparison Example 2.

Next, the silicon carbide semiconductor device according to Embodiment 3 was tested for formation of stacking faults. FIG. 7 is a plan view illustrating the planar layout of a silicon carbide semiconductor device according to Comparison Example 2. First, following the method of manufacturing the silicon carbide semiconductor device according to Embodiment 3 as described above, a MOSFET of the type illustrated in FIG. 6 was produced using the conditions described above (Working Example 3). Then, a current yielding a current density of 2500 A/cm² was passed in the forward direction through the parasitic diodes in the inner peripheral cells 24a of Working Example 3. Moreover, a current yielding the same current density as in Working Example 3 was passed in the forward direction through the parasitic diodes in the inner peripheral cells 24a of the MOSFET according to Comparison Example 2 and illustrated in FIG. 7. The MOSFET according to Comparison Example 2 is different from Working Example 3 in that the width d13 of a p⁺ contact region 66c of the outermost peripheral cell 24b is greater than the width d11 of the p⁺ contact regions 66a of the inner peripheral cells 24a.

In this way, it was confirmed in Comparison Example 2 that, similar to in Comparison Example 1, stacking faults starting from basal plane dislocations in the n⁺ starting substrate 1 expand into the portion directly beneath the p⁺ contact region 66c of the outermost peripheral cell 24b. In contrast, it was confirmed in Working Example 3 that, similar to in Working Example 1, stacking faults starting from basal plane dislocations in the n⁺ starting substrate 1 did not form in the portion directly beneath the p⁺ contact region 66b of the outermost peripheral cell 24b.

In Embodiment 3 as described above, the p⁺ contact region of the outermost peripheral cell is formed in a substantially rectangular frame-shaped planar shape that surrounds the periphery of the active region and has a width less than the width of the p⁺ contact regions of the inner peripheral cells, thereby making it possible to achieve the same advantageous effects as in Embodiments 1 and 2 even when the inner peripheral cells are arranged in a stripe-shaped planar layout.

Embodiment 4

Figure 8:
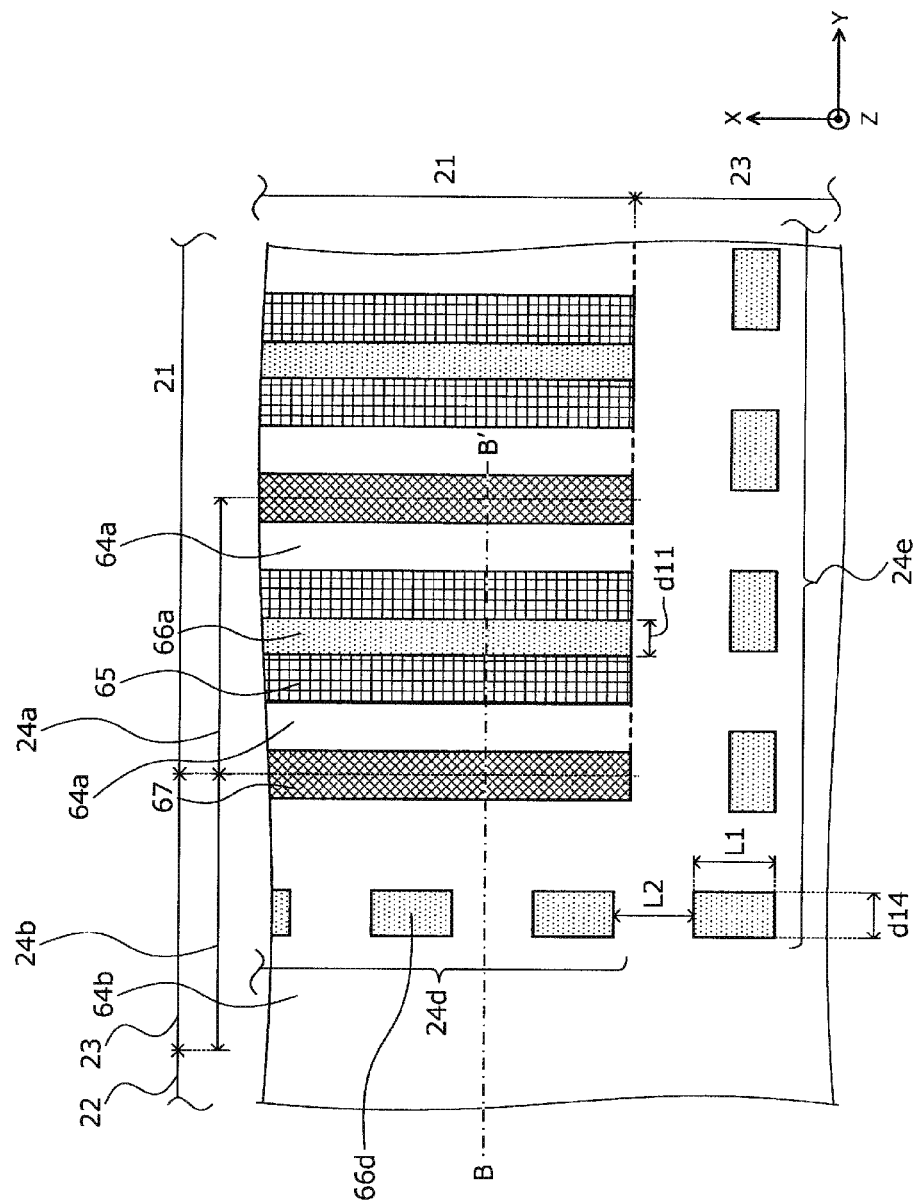
FIG. 8 is a plan view illustrating the planar layout of the primary components of a silicon carbide semiconductor device according to Embodiment 4.

Next, the structure of a silicon carbide semiconductor device according to Embodiment 4 will be described. FIG. 8 is a plan view illustrating the planar layout of the primary components of the silicon carbide semiconductor device according to Embodiment 4. The cross-sectional structure taken along line B-B' in FIG. 8 is the same as in FIG. 1 except in that the reference characters 4a, 4b, 5, 6a, 6b, 7, d3, and d4 in FIG. 1 are replaced with 64a, 64b, 65, 66a, 66d, 67, d11, and d14. The silicon carbide semiconductor device according to Embodiment 4 is different from the silicon carbide semiconductor device according to Embodiment 3 in that the total surface area (area density) of $p^+$ contact regions 66d of the outermost peripheral cells 24b is reduced in a region 24d that faces the inner peripheral cells 24a in the second direction Y.

More specifically, a plurality of the $p^+$ contact regions 66d of the outermost peripheral cells 24b are arranged in a dotted manner in a planar layout that runs along the outer periphery of the active region 21, is separated from the active region 21, and surrounds the periphery of the active region 21. The $p^+$ contact regions 66d arranged in the boundary region 23 each have a substantially rectangular planar shape. Among the $p^+$ contact regions 66d arranged in the boundary region 23, the $p^+$ contact regions 66d in the region 24d that faces the inner peripheral cells 24a in the second direction Y are set to have dimensions d14 and L1 that satisfy formula (4) below. The dimensions d14 and L1 are the dimensions along two sides of each $p^+$ contact region 66d that share a vertex. The pitch L2 corresponds to the gaps between adjacent $p^+$ contact regions 66d. Among the $p^+$ contact regions 66d arranged in the boundary region 23, the dimensions d14 and L1 and the pitch L2 may be different between the region 24d that faces the inner peripheral cells 24a in the second direction Y and a region 24e that faces the inner peripheral cells 24a in the first direction X.

$$0.5 \cdot d11 \leq d14 \cdot L1/(L1+L2) \leq 0.9 \cdot d11 \qquad (4)$$

Among the $p^+$ contact regions 66d arranged in the boundary region 23, the $p^+$ contact regions 66d in the region 24d that faces the inner peripheral cells 24a in the second direction Y are set to have the dimensions d14 and L1 that satisfy formula (4) above for the following reasons. The smaller the area density of the $p^+$ contact regions 66d (that is, the total surface area of the $p^+$ contact regions 66d) is relative to the surface area of the boundary region 23, the weaker the resulting hole extraction effect. If $d14 \cdot L1/(L1+L2) < 0.5 \cdot d11$, the weakness of the resulting hole extraction effect of the $p^+$ contact regions 66d increases the reverse recovery time of the parasitic diodes in the outermost peripheral cells 24b, which causes various problems such as reduced switching speed and increased switching loss. Meanwhile, if $0.9 \cdot d11 < d14 \cdot L1/(L1+L2)$, the resulting reduction in the incidence of recombination of electron-hole pairs in the portions directly beneath the $p^+$ contact regions 66d of the outermost peripheral cells 24b is too low.

In a method of manufacturing the silicon carbide semiconductor device according to Embodiment 4, the ion implantation masks used in the method of manufacturing the silicon carbide semiconductor device according to Embodiment 3 should be modified as needed in order to form the $p^+$ contact regions 66d of the outermost peripheral cells 24b.

Working Example 4

Next, the silicon carbide semiconductor device according to Embodiment 4 was tested for formation of stacking faults.

First, following the method of manufacturing the silicon carbide semiconductor device according to Embodiment 4 as described above, a MOSFET of the type illustrated in FIG. 8 was produced using the conditions described above (Working Example 4). Then, a current yielding a current density of 2500 A/cm² was passed in the forward direction through the parasitic diodes in the inner peripheral cells 24a of Working Example 4. In this way, it was confirmed in Working Example 4 that similar to in Working Example 3, stacking faults starting from basal plane dislocations in the $n^+$ starting substrate 1 did not form in the portions directly beneath the $p^+$ contact regions 66d of the outermost peripheral cells 24b.

In Embodiment 4 as described above, a plurality of the $p^+$ contact regions of the outermost peripheral cells are arranged in a dotted manner in a substantially rectangular planar layout that surrounds the periphery of the active region, thereby making it possible to achieve the same advantageous effects as in Embodiments 1 to 3 regardless of the surface area of the individual $p^+$ contact regions of the outermost peripheral cells when the inner peripheral cells are arranged in a stripe-shaped planar layout.

Embodiment 5

Figure 9:
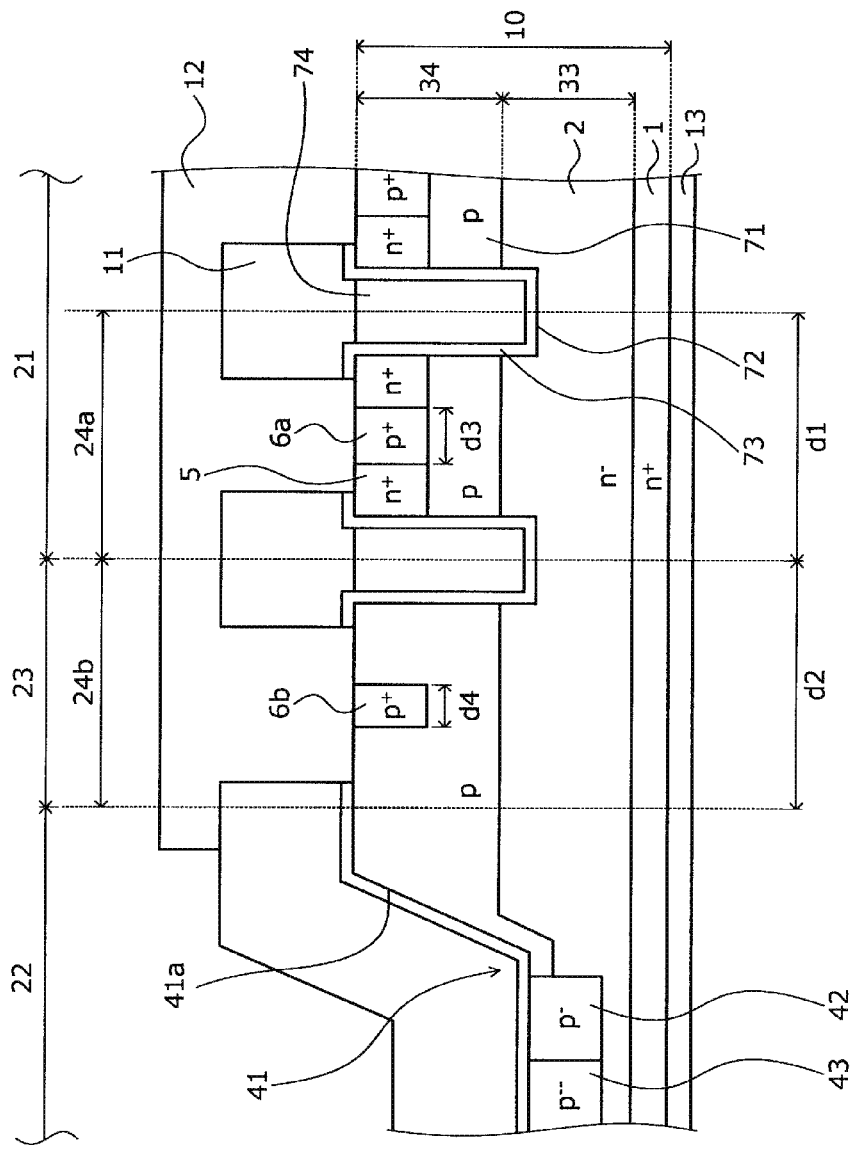
FIG. 9 is a cross-sectional view illustrating the structure of a silicon carbide semiconductor device according to Embodiment 5.

Next, the structure of a silicon carbide semiconductor device according to Embodiment 5 will be described. FIG. 9 is a cross-sectional view illustrating the structure of the silicon carbide semiconductor device according to Embodiment 5. The planar layouts of inner peripheral cells 24a and outermost peripheral cells 24b of the silicon carbide semiconductor device according to Embodiment 5 are the same as in FIG. 2. The silicon carbide semiconductor device according to Embodiment 5 is different from the silicon carbide semiconductor device according to Embodiment 1 in that the MOS gate structures for the inner peripheral cells 24a are changed from planar gate structures to trench gate structures.

More specifically, the MOS gate structure for each inner peripheral cell 24a includes a p-type base region 71, an $n^+$ source region 5, a $p^+$ contact region 6a, a trench 72, a gate insulating film 73, and a gate electrode 74. A silicon carbide substrate 10 is an epitaxial substrate in which silicon carbide layers 33 and 34 (which will respectively become an $n^-$ drift region 2 and the p-type base region 71) are epitaxially grown in order on the front surface of an $n^+$ starting substrate 1 made of silicon carbide. The p-type base region 71 extends from an active region 21 into an edge termination region 22. Moreover, the p-type base region 71 is connected to a first JTE region 42 by a p-type region formed in a stair 41a in a level difference 41 between a boundary region 23 and the edge termination region 22.

The $n^+$ source region 5 and the $p^+$ contact region 6a are both selectively formed within the p-type base region 71. The trench 72 goes through the $n^+$ source region 5 and the p-type base region 71 and reaches the $n^-$ drift region 2. The gate insulating film 73 is formed along the inner walls of the trench 72. The gate electrode 74 is formed on the gate insulating film 73 inside the trench 72 and so as to be buried within the trench 72. The region from the widthwise center of one trench 72 to the widthwise center of another trench 72 that is adjacent to that one trench 72 corresponds to one inner peripheral cell 24a. An interlayer insulating film 11 is formed spanning over the entire substrate front surface from the active region 21 to the edge termination region 22 and covering the gate electrode 74.

The configuration of a source electrode 12, a drain electrode 13, and the edge termination region 22 are the same as in Embodiment 1. The source electrode 12 is filled into grooves (onto mesa portions) formed between the trenches 72, and contacts between the n$^+$ source regions 5 and p$^+$ contact regions 6a and the source electrode 12 may be formed along the inner walls of these grooves as well. The outermost peripheral cells 24b are arranged in the portion extending from the widthwise center of the outermost trench 72 to a prescribed distance (length d2) on the outer side. p$^+$ contact regions 6b for the outermost peripheral cells 24b are selectively formed within the p-type base region 71 in the boundary region 23. The configuration of the p$^+$ contact regions 6b of the outermost peripheral cells 24b is the same as in Embodiment 1.

In a method of manufacturing the silicon carbide semiconductor device according to Embodiment 5, the following three processes in the method of manufacturing the silicon carbide semiconductor device according to Embodiment 1 should be modified as described below. The first difference is that the silicon carbide substrate (semiconductor wafer) 10 is produced by epitaxially growing an n$^-$ silicon carbide layer 33 and a p-type silicon carbide layer 34 in that order on the n$^+$ starting substrate (starting wafer) 1. The second difference is that the ion implantation process is repeated under different conditions to selectively form the n$^+$ source regions 5, the p$^+$ contact regions 6a and 6b, and the first and second JTE regions 42 and 43. The third difference is that after activation annealing, the trenches 72 are formed before forming the gate insulating films 73.

Embodiment 5 may be applied to Embodiments 2 to 4 to modify the planar layouts of the inner peripheral cells 24a or the outermost peripheral cells 24b.

Embodiment 5 as described above makes it possible to achieve the same advantageous effects as in Embodiments 1 to 4 even when a trench gate structure is used as the cell structure for each unit cell.

Embodiment 6

Next, the structure of a silicon carbide semiconductor device according to Embodiment 6 will be described. The silicon carbide semiconductor device according to Embodiment 6 is different from the silicon carbide semiconductor device according to Embodiment 1 in the following two respects. The first difference is that the surface area S2 of the p$^+$ contact regions 6b of the outermost peripheral cells 24b is equal to the surface area S1 of the p$^+$ contact regions 6a of the inner peripheral cells 24a. The second difference is that the impurity concentration of the p$^+$ contact regions 6b of the outermost peripheral cells 24b is less than the impurity concentration of the p$^+$ contact regions 6a of the inner peripheral cells 24a.

In other words, the resistance R2 of the p$^+$ contact regions 6b of the outermost peripheral cells 24b is greater than the resistance R1 of the p$^+$ contact regions 6a of the inner peripheral cells 24a, and it is preferable that these resistance values satisfy formula (5) below. The reasons for this are the same as the reasons why it is preferable in Embodiment 1 that the surface area S2 of the p$^+$ contact regions 6b satisfy formula (1). In other words, reducing the impurity concentration of the p$^+$ contact regions 6b of the outermost peripheral cells 24b instead of reducing the area density of the p$^+$ contact regions 6b of the outermost peripheral cells 24b still makes it possible to achieve the same advantageous effects as in Embodiment 1.

$$1.1 \cdot R1 \leq R2 \leq 2.0 \cdot R1 \tag{5}$$

Embodiment 6 may be applied to Embodiment 3 to create a configuration in which the inner peripheral cells 24a are arranged in a stripe-shaped planar layout, the width of the p$^+$ contact region of the outermost peripheral cell 24b is equal to the width of the p$^+$ contact regions of the inner peripheral cells 24a, and the impurity concentration of the p$^+$ contact region of the outermost peripheral cell 24b is less than the impurity concentration of the p$^+$ contact regions of the inner peripheral cells 24a.

In Embodiment 6 as described above, setting the impurity concentration of the p$^+$ contact regions of the outermost peripheral cells to be less than the impurity concentration of the p$^+$ contact regions of the inner peripheral cells makes it possible to set the resistance of the p$^+$ contact regions of the outermost peripheral cells to be higher than the resistance of the p$^+$ contact regions of the inner peripheral cells even when the p$^+$ contact regions of the inner peripheral cells and the outermost peripheral cells have the same area density. This makes it possible to achieve the same advantageous effects as in Embodiments 1 to 5.

The present invention is not limited to the embodiments described above, and various modification may be made without departing from the spirit of the present invention. For example, in Embodiments 1 to 5, the impurity concentration of the p$^+$ contact regions of the outermost peripheral cells may be set to be less than the impurity concentration of the p$^+$ contact regions of the inner peripheral cells. Moreover, although the embodiments described above were described using a MOSFET as an example, the present invention may be applied to various devices having a structure in which recombination of electron-hole pairs occurs in a silicon carbide substrate due to formation of a parasitic element that includes a p$^+$ contact region as one component thereof. More specifically, the present invention may be applied to devices such as p-n junction diodes and junction barrier Schottky (JBS) diodes, for example. In this case, the impurity concentrations of regions that form diode structures in the outermost peripheral cells should respectively be set to be less than the impurity concentrations of the corresponding regions that form diode structures in the inner peripheral cells. Furthermore, the present invention still exhibits all of the same advantageous effects even if the conductivity types (n-type and p-type) are inverted.

INDUSTRIAL APPLICABILITY

The silicon carbide semiconductor device according to the present invention as described above is suitable for application to power semiconductor devices used in vehicles or railways, for example.

It will be apparent to those skilled in the art that various modifications and variations can be made in the present invention without departing from the spirit or scope of the invention. Thus, it is intended that the present invention cover modifications and variations that come within the scope of the appended claims and their equivalents. In particular, it is explicitly contemplated that any part or whole of any two or more of the embodiments and their modifications described above can be combined and regarded within the scope of the present invention.

What is claimed is:
1. A silicon carbide semiconductor device, comprising:
a semiconductor substrate made of silicon carbide, the semiconductor substrate having one or more of first cells and one or more of second cells defined therein;
wherein each of the first cells comprises:

a first semiconductor region of a first conductivity type formed in a surface layer of a first principal surface of the semiconductor substrate;

a second semiconductor region of a second conductivity type selectively formed in a surface layer of a second principal surface of the semiconductor substrate;

a third semiconductor region of the first conductivity type that is formed between the first semiconductor region and the second semiconductor region, contacts the first semiconductor region and the second semiconductor region, and has a lower impurity concentration than the first semiconductor region;

a fourth semiconductor region of the first conductivity type selectively formed within the second semiconductor region;

a fifth semiconductor region of the second conductivity type that is selectively formed within the second semiconductor region and has a higher impurity concentration than the second semiconductor region;

a gate insulating film formed contacting a region of the second semiconductor region between the third semiconductor region and the fourth semiconductor region; and a gate electrode formed on a side opposite to the second semiconductor region with the gate insulating film between the gate electrode and the second semiconductor region, wherein each of the second cells has the same constructions as the first cell with respect to the first to fifth semiconductor regions except that said fourth semiconductor region of the first conductivity type is absent and that the respective fifth semiconductor regions in the first and second cells may or may not be different in property or dimension, wherein the silicon carbide semiconductor device further comprises:

a first electrode that contacts the fourth semiconductor region and the fifth semiconductor region of each of the first cells and the fifth semiconductor region of each of the second cells; and a second electrode that contacts the first semiconductor region of each of the first cells and each of the second cells, and wherein a unit total resistance of the fifth semiconductor regions of the second cells, as measured in a depth direction of the semiconductor substrate with respect to a unit area in a surface of the semiconductor substrate, is greater than a unit total resistance of the fifth semiconductor regions of the first cells, as measured in the depth direction of the semiconductor substrate with respect to the unit area in the surface of the semiconductor substrate.

2. The silicon carbide semiconductor device according to claim 1, wherein the first cells are arranged in a plurality in a matrix-shaped layout in an active region, wherein the second cells are arranged in a plurality in a layout that runs along an outer periphery of the active region and surrounds a periphery of the active region, and wherein a surface area of the fifth semiconductor region of each of the second cells is less than a surface area of the fifth semiconductor region of each of the first cells.

3. The silicon carbide semiconductor device according to claim 1, wherein the first cells are arranged in a plurality in a matrix-shaped layout in an active region, wherein the second cells are arranged in a plurality in a layout that runs along an outer periphery of the active region and surrounds a periphery of the active region, and wherein a number of the second cells per unit area is less than a number of the first cells per unit area.

4. The silicon carbide semiconductor device according to claim 1, wherein the second cells are provided in a plurality, and the fifth semiconductor regions of the plurality of second cells are arranged separated from one another at equally spaced intervals.

5. The silicon carbide semiconductor device according to claim 1, wherein the first cells are arranged in a plurality in a matrix-shaped layout in an active region, wherein the second cells are arranged in a plurality in a layout that runs along an outer periphery of the active region and surrounds a periphery of the active region, and wherein an impurity concentration of the fifth semiconductor regions of each of the second cells is less than an impurity concentration of the fifth semiconductor regions of each of the first cells.

6. The silicon carbide semiconductor device according to claim 1, wherein the first cells are arranged in a plurality in a stripe-shaped layout in an active region, wherein the second cell is provided singly and has a rectangular frame shape that runs along an outer periphery of the active region and surrounds a periphery of the active region, and wherein a width of the fifth semiconductor region of the second cell is less than a width of the fifth semiconductor region of each of the first cells.

7. The silicon carbide semiconductor device according to claim 1, wherein the first cells are arranged in a plurality in a stripe-shaped layout in an active region, wherein the second cell is provided singly and has a rectangular frame shape that runs along an outer periphery of the active region and surrounds a periphery of the active region, wherein the fifth semiconductor region of the second cell is arranged in a plurality in a layout that runs along the outer periphery of the active region and surrounds the periphery of the active region, and wherein, among the plurality of fifth semiconductor regions of the second cell, a total surface area of the fifth semiconductor regions that are arranged running in a first direction in which the first cell extends in the stripe shape is less than a surface area of the fifth semiconductor region of each of the first cells.

8. The silicon carbide semiconductor device according to claim 1, wherein the first cells are arranged in a plurality in a stripe-shaped layout in an active region, wherein the second cell is provided singly and has a rectangular planar shape that runs along an outer periphery of the active region and surrounds a periphery of the active region, and wherein an impurity concentration of the fifth semiconductor region of the second cell is less than an impurity concentration of the fifth semiconductor region of each of the first cells.

9. A power module, comprising the silicon carbide semiconductor device according to claim 1.

10. The silicon carbide semiconductor device according to claim 1, wherein said unit total resistance of the fifth semiconductor regions of the second cells is smaller than a prescribed resistance.

11. The silicon carbide semiconductor device according to claim 10, wherein said unit total resistance of the fifth semiconductor regions of the second cells is smaller than R/0.5, where R is said unit total resistance of the fifth semiconductor regions of the first cells.

12. The silicon carbide semiconductor device according to claim 1, wherein said unit total resistance of the fifth semiconductor regions of the second cells is greater than R/0.9, where R is said unit total resistance of the fifth semiconductor regions of the first cells.

13. The silicon carbide semiconductor device according to claim 1, wherein said unit total resistance of the fifth semiconductor regions of the second cells is greater than R/0.9 and is smaller than R/0.5, where R is said unit total resistance of the fifth semiconductor regions of the first cells.

\* \* \* \* \*